(12) United States Patent
Shigetoshi

(10) Patent No.: US 9,865,549 B2
(45) Date of Patent: Jan. 9, 2018

(54) SEMICONDUCTOR DEVICE, MANUFACTURING METHOD THEREOF, AND ELECTRONIC APPARATUS

(71) Applicant: Sony Corporation, Tokyo (JP)

(72) Inventor: Takushi Shigetoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/505,006

(22) Filed: Oct. 2, 2014

(65) Prior Publication Data

US 2015/0097258 A1 Apr. 9, 2015

(30) Foreign Application Priority Data

Oct. 9, 2013 (JP) ................... 2013-211642

(51) Int. Cl.
| | |
|---|---|
| *H01L 23/538* | (2006.01) |
| *H01L 27/146* | (2006.01) |
| *H01L 23/528* | (2006.01) |
| *H01L 23/522* | (2006.01) |
| *H01L 21/768* | (2006.01) |
| *H01L 23/48* | (2006.01) |
| *H01L 29/06* | (2006.01) |

(52) U.S. Cl.
CPC .... *H01L 23/5383* (2013.01); *H01L 21/76898* (2013.01); *H01L 23/481* (2013.01); *H01L 23/528* (2013.01); *H01L 23/5226* (2013.01); *H01L 23/5283* (2013.01); *H01L 23/538* (2013.01); *H01L 27/14634* (2013.01); *H01L 27/14636* (2013.01); *H01L 27/14678* (2013.01); *H01L 27/14641* (2013.01); *H01L 29/0623* (2013.01); *H01L 2224/08145* (2013.01); *H01L 2224/24147* (2013.01); *H01L 2224/80896* (2013.01); *H01L 2224/8203* (2013.01); *H01L 2224/92* (2013.01); *H01L 2924/0002* (2013.01)

(58) Field of Classification Search
CPC ... H01L 23/52; H01L 23/522; H01L 23/5226; H01L 23/528; H01L 23/5283
See application file for complete search history.

(56) References Cited

U.S. PATENT DOCUMENTS

| | | | | |
|---|---|---|---|---|
| 2007/0246816 | A1* | 10/2007 | Tajika | H01L 21/76898 257/686 |
| 2009/0134497 | A1* | 5/2009 | Barth | H01L 21/76898 257/621 |
| 2012/0241981 | A1* | 9/2012 | Hirano | H01L 23/522 257/777 |

FOREIGN PATENT DOCUMENTS

JP 2010-219526 A 9/2010

* cited by examiner

*Primary Examiner* — Eduardo A Rodela
(74) *Attorney, Agent, or Firm* — Sheridan Ross P.C.

(57) ABSTRACT

A semiconductor device includes a wiring layer that includes at least one low-dielectric rate interlayer insulating film layer; a guard ring that is formed by placing in series a wire and a via so as to be in contact with a through electrode, in a portion in which the through electrode passing through the wiring layer is formed; and the through electrode that is formed by being buried inside the guard ring.

14 Claims, 40 Drawing Sheets

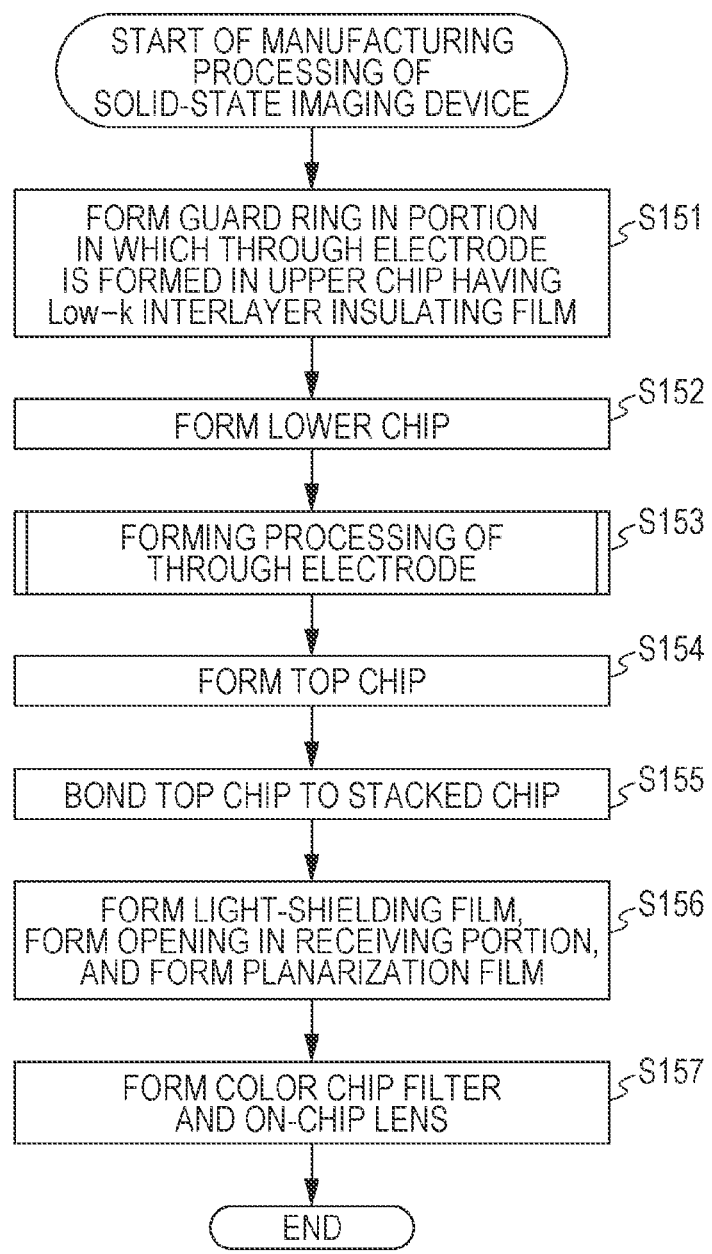

SEMICONDUCTOR DEVICE, MANUFACTURING METHOD THEREOF, AND ELECTRONIC APPARATUS

CROSS REFERENCE TO RELATED APPLICATIONS

This application claims the benefit of Japanese Priority Patent Application JP 2013-211642 filed Oct. 9, 2013, the entire contents of which are incorporated herein by reference.

BACKGROUND

The present technology relates to a semiconductor device, a manufacturing method thereof, and an electronic apparatus, and particularly to a semiconductor device which can reduce a failure rate when a through electrode of a low-dielectric rate insulating film is formed, a manufacturing method thereof, and an electronic apparatus.

According to higher integration caused by miniaturization of an LSI manufacturing process, an electronic apparatus including a computer has achieved high performance such as miniaturization, multi-function, and high speed so far. However, by realization of further miniaturization, a technology reaches a limit, and as one of the technologies that overcome the limit of miniaturization in a plane, a three-dimensional packaging technology development has been activated.

An Si through electrode (through-silicon via: TSV) is an electrode which vertically passes through the inside of a silicon semiconductor chip, and is one of the most important technologies in the three-dimensional packaging technology development. In order to accommodate a plurality of chips in a single package by stacking the chips, connection of upper and lower chips heretofore performed by wire bonding is performed by the TSV.

As a method for bonding two or more wafers and for forming the TSV of through wires between the plurality of wafers and wires, as disclosed in, for example, Japanese Unexamined Patent Application Publication No. 2010-219526, there has been proposed a method for forming the TSV in a process before and after a FEOL process of a general LSI manufacturing process, forming the TSV after a so-called via-first process, the BEOL process of the LSI manufacturing process, or a thin film process of a wafer, and combining the TSV in a so-called via-last process.

Furthermore, as a method for reducing the number of processes or decreasing an area occupied by the TSV section, as disclosed in U.S. Pat. No. 7,714,446, there has been considered a method for bonding two chips using one through electrode, so-called forming a shared contact through electrode.

SUMMARY

However, if the above-described shared contact through electrode uses a low-dielectric rate insulating film (hereinafter, referred to as Low-k insulating film) which is used for a semiconductor element of a state-of-the-art LSI, as an interlayer insulating film, in a structure in which chip wiring is bonded in a single layer with respect to the through electrode, the Low-k insulating film retreats at the time of plasma etching or cleaning, and abnormality of a processed shape occurs.

Such abnormality of the processed shape produces a plane in which it is difficult to form a film with eaves when barrier metal is formed at the time of filling the through electrode with metal which is a post-process, causes a void to be produced at the time of plating metal, and causes wiring reliability of a semiconductor element to be degraded.

In addition to the abnormality of the processed shape, the Low-k materials are changed by damage at the time of plasma etching, or by absorbing moisture at the time of cleaning or while in the atmosphere, and causes an element characteristic to be degraded.

It is desirable to reduce a failure rate when a through electrode of a low-dielectric rate insulating film is formed.

According to an embodiment of the present technology, there is provided a semiconductor device including: a wiring layer that includes at least one low-dielectric rate interlayer insulating film layer; a guard ring that is formed by placing in series a wire and a via so as to be in contact with a through electrode, in a portion in which the through electrode passing through the wiring layer is formed; and the through electrode that is formed by being buried inside the guard ring.

In the embodiment, the guard ring may be electrically connected.

In the embodiment, a plurality of semiconductor substrates may be stacked, and the semiconductor substrate including the wiring layer may be electrically connected to another semiconductor substrate through the through electrode.

In the embodiment, the semiconductor substrate including a contact image sensor (CIS) may be stacked on the semiconductor substrate including the wiring layer.

In the embodiment, the semiconductor substrate including the wiring layer may be configured to include a signal processing circuit.

In the embodiment, the semiconductor substrate including the wiring layer may be configured to include a contact image sensor (CIS).

In the embodiment, another semiconductor substrate may be configured to include a signal processing circuit.

In the embodiment, another semiconductor substrate may be configured to include a storage medium circuit.

According to another embodiment of the present technology, there is provided a manufacturing method of a semiconductor device, including: forming a guard ring by placing in series a wire and a via so as to be in contact with a through electrode, in a portion in which the through electrode passing through a wiring layer is formed, in the wiring layer that includes at least one low-dielectric rate interlayer insulating film layer, using a manufacturing device; and forming the through electrode inside the formed guard ring, using the manufacturing device.

According to still another embodiment of the present technology, there is provided an electronic apparatus including: a semiconductor device, in which the semiconductor device includes a wiring layer which includes at least one low-dielectric rate interlayer insulating film layer; a guard ring that is formed by placing in series a wire and a via so as to be in contact with a through electrode, in a portion in which the through electrode passing through the wiring layer is formed; and the through electrode that is formed by being buried inside the guard ring.

In the embodiment, the semiconductor device may be a solid-state imaging device, and the semiconductor device may further include a signal processing circuit that processes an output signal that is output from the solid-state imaging device and an optical system that makes incident light be incident on the solid-state imaging device.

According to still another embodiment of the present technology, a guard ring is formed by placing in series a wire and a via so as to be in contact with a through electrode, in a portion in which the through electrode passing through a wiring layer is formed, in the wiring layer that includes at least one low-dielectric rate interlayer insulating film layer; and the through electrode is formed inside the formed guard ring.

According to the present technology, it is possible to form a through electrode in a low-dielectric rate insulating film. In addition, according to the present technology, it is possible to decrease a failure rate when the through electrode of the low-dielectric rate insulating film is formed.

In addition, the effects described in the present specification are only exemplification, the effects of the present technology are not limited to the effects described in the present specification, and there may be additional effects.

BRIEF DESCRIPTION OF THE DRAWINGS

FIG. 14 is a flow chart for explaining manufacturing processing of a solid-state imaging device according to a third embodiment of the present technology;

DETAILED DESCRIPTION OF EMBODIMENTS

Hereinafter, forms (hereinafter, referred to as embodiments) for executing the present technology will be described. In addition, the description will be made in the following sequence.

0. Schematic Configuration Example of Solid-State Imaging Device
1. First Embodiment (Example of Semiconductor Device of Two Layers)
2. Second Embodiment (Example of Semiconductor Device of Two Layers)
3. Third Embodiment (Example of Semiconductor Device of Three Layers)
4. Fourth Embodiment (Example of Semiconductor Device of Three Layers)
5. Fifth Embodiment (Modification Example)
6. Sixth Embodiment (Example of Electronic Apparatus)

0. Schematic Configuration Example of Solid-State Imaging Device

Schematic Configuration Example of Solid-State Imaging Device

Figure 1:
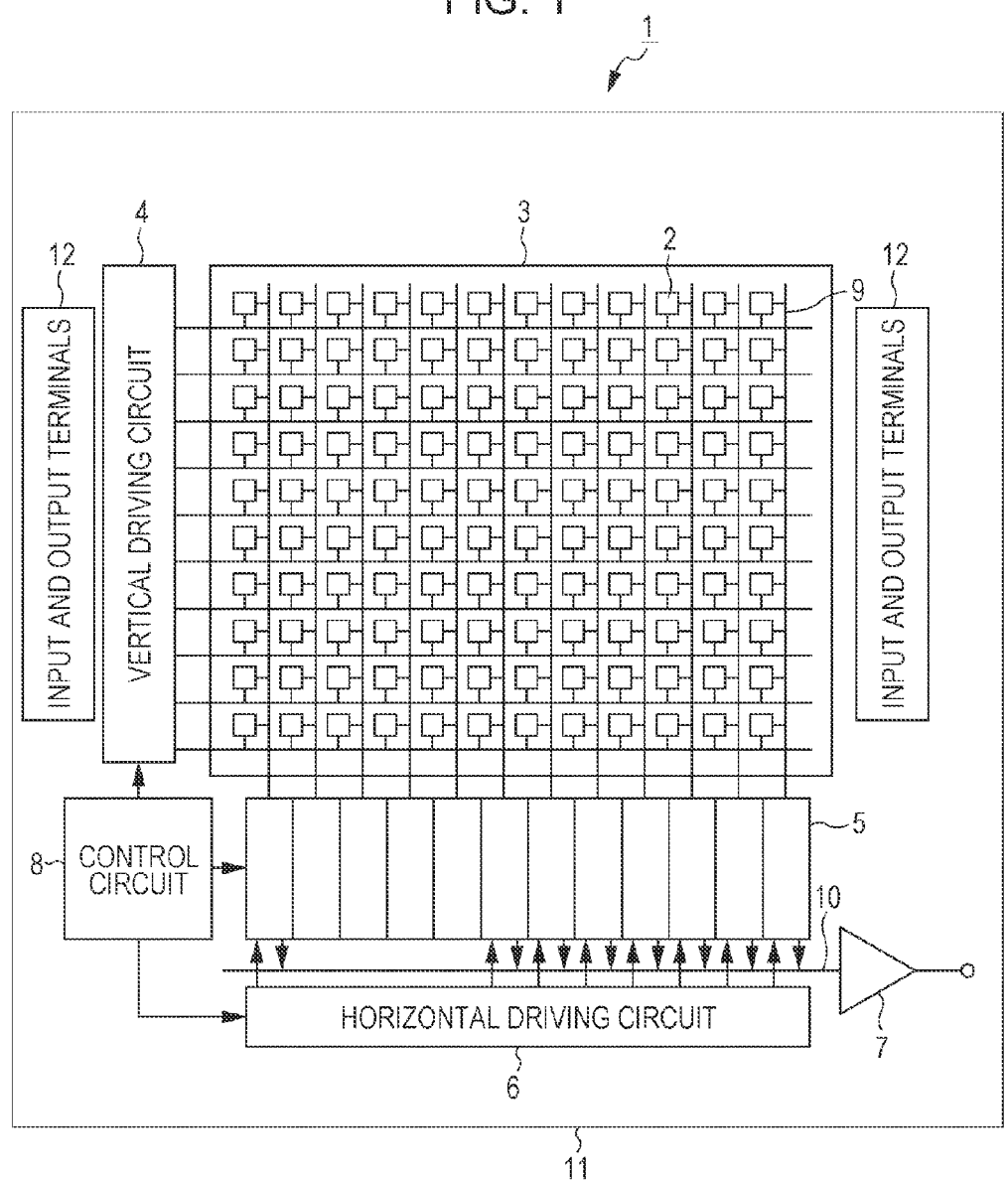
FIG. 1 is a block diagram illustrating a schematic configuration example of a solid-state imaging device to which the present technology is applied.

FIG. 1 illustrates a schematic configuration example of an example of a Complementary Metal Oxide Semiconductor (CMOS) solid-state imaging device which is applied to each embodiment of the present technology.

As illustrated in FIG. 1, a solid-state imaging device (element chip) 1 includes a pixel area (a so-called imaging area) 3 in which pixels 2 including a plurality of photoelectric conversion elements are regularly and two-dimensionally arranged in a semiconductor substrate 11 (for example, silicon substrate), and a peripheral circuit unit.

The pixel 2 includes a photoelectric conversion element (for example, a photo diode) and a plurality of pixel transistors (so-called MOS transistors). The plurality of pixel transistors can each be configured with three transistors such as a transfer transistor, a reset transistor, and an amplification transistor, and furthermore, can be configured with four transistors with a selection transistor in addition to the three transistors. An equivalent circuit of each pixel 2 (unit pixel) is the same as that of a general pixel, and thus, hereinafter, detailed description thereof will not be repeated.

In addition, the pixel 2 can also be configured by a pixel sharing structure. The pixel sharing structure is configured with a plurality of photo diodes, a plurality of transfer transistors, one shared floating diffusion, and another shared pixel transistor.

The periphery circuit unit is configured with a vertical driving circuit 4, a column signal processing circuit 5, a horizontal driving circuit 6, an output circuit 7, and a control circuit 8.

The control circuit 8 receives data instructing an input clock, an operation mode, or the like, and in addition, outputs data of internal information or the like of the solid-state imaging device 1. Specifically, based on a vertical synchronization signal, a horizontal synchronization signal, and a master clock, the control circuit 8 generates a clock signal or a control signal which becomes a reference of operations of the vertical driving circuit 4, the column signal processing circuits 5, and the horizontal driving circuit 6. Then, the control circuit 8 inputs such signals to the vertical driving circuit 4, the column signal processing circuits 5, and the horizontal driving circuit 6.

The vertical driving circuit 4 is configured by, for example, a shift register, selects a pixel driving wire, supplies a pulse for driving the pixel 2 to the selected pixel driving wire, and drives the pixels 2 by a row. Specifically, the vertical driving circuit 4 selectively scans each pixel 2 in the pixel area 3 by a row sequentially in a vertical direction, and supplies the column signal processing circuit 5 with a pixel signal based on signal charges generated according to the received amount of light in the photoelectric conversion element of each pixel 2 through a vertical signal line 9.

For example, the column signal processing circuit 5 is arranged in each column of the pixel, and performs signal processing, such as noise removal or the like for each pixel column with respect to a signal output from the pixels 2 of one column. Specifically, the column signal processing circuit 5 performs signal processing, such as correlated double sampling (CDS) for removing inherent fixed pattern noise of the pixel 2, signal amplification, or analog/digital (A/D) conversion. Horizontal selection switches (not illustrated) are connected between output stages of the column signal processing circuits 5 and a horizontal signal line 10.

The horizontal driving circuit 6 is configured by, for example, a shift register, sequentially selects each column signal processing circuit 5 by sequentially outputting the horizontal scanning pulses, and outputs the pixel signal from each column signal processing circuit 5 to the horizontal signal line 10.

The output circuit 7 performs signal processing with respect to the signal sequentially supplied through the horizontal signal line 10 from each column signal processing circuit 5 and outputs the signal-processed signal. For example, the output circuit 7 performs only buffering, or performs black level adjustment, column variation correction, various digital signal processing, or the like.

Input and output terminals 12 are provided to exchange a signal with an external device.

Figure 2A:
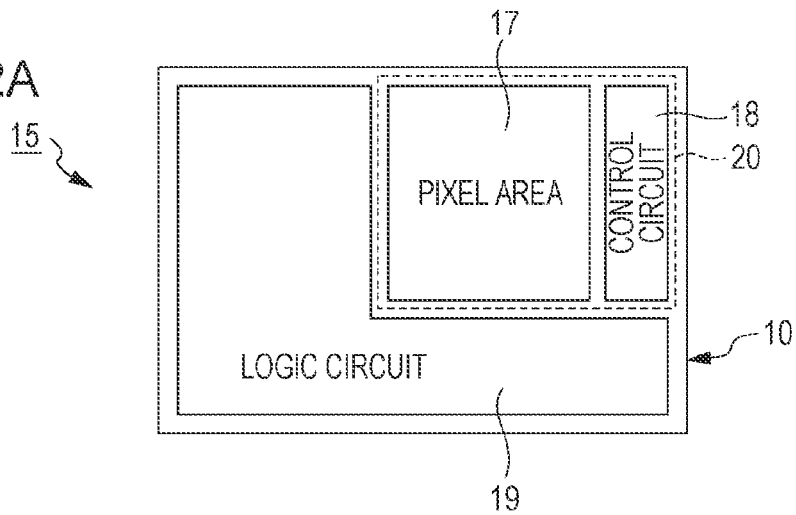
FIGS. 2A to 2C illustrate basic schematic configurations of a solid-state imaging device according to an embodiment of the present technology.
Figure 2B:
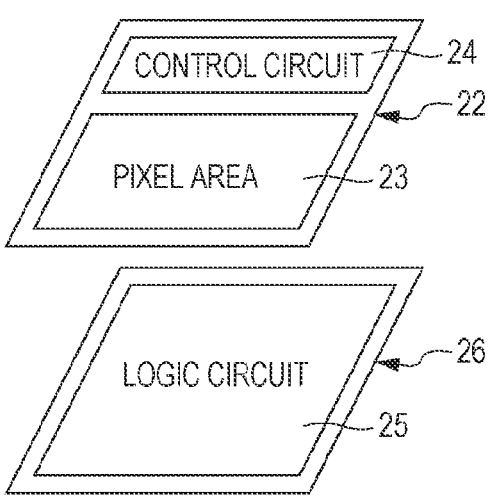
Figure 2C:
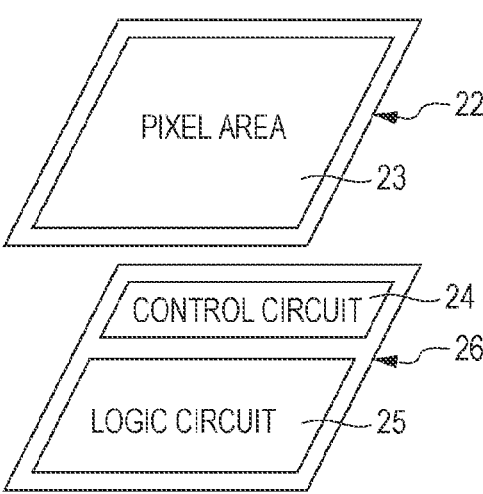

FIGS. 2A to 2C illustrate basic schematic configurations of a solid-state imaging device according to an embodiment of the present technology.

As illustrated in FIG. 2A, a solid-state imaging device 15 is configured to include a pixel area 17, a control circuit 18, and a logic circuit 19 for signal processing which are included in one semiconductor chip 16. In general, an image sensor 20 is configured by the pixel area 17 and the control circuit 18.

In contrast to this, as illustrated in FIG. 2B, the solid-state imaging device according to the embodiment of the present technology includes the pixel area 23 and the control circuit 24 in a first semiconductor chip unit 22, and includes a logic circuit 25 which includes a signal processing circuit for signal processing in a second semiconductor chip unit 26. In addition, the control circuit 24 includes, for example, the vertical driving circuit 4, the horizontal driving circuit 6, the control circuit 8, and the like which are illustrated in FIG. 1. In addition, the logic circuit 25 includes, for example, a signal processing circuit for performing correction, or the signal processing of gain or the like with respect to an output of the output circuit 7 illustrated in FIG. 1.

Alternatively, in addition, as illustrated in FIG. 2C, the solid-state imaging device according to the embodiment of the present technology includes the pixel area 23 in the first semiconductor chip unit 22, and includes the control circuit 24 and the logic circuit 25 including the signal processing circuit in the second semiconductor chip unit 26.

Then, by electrically connecting the first semiconductor chip unit 22 to the second semiconductor chip unit 26, the solid-state imaging device is configured as one semiconductor chip.

Figure 3A:
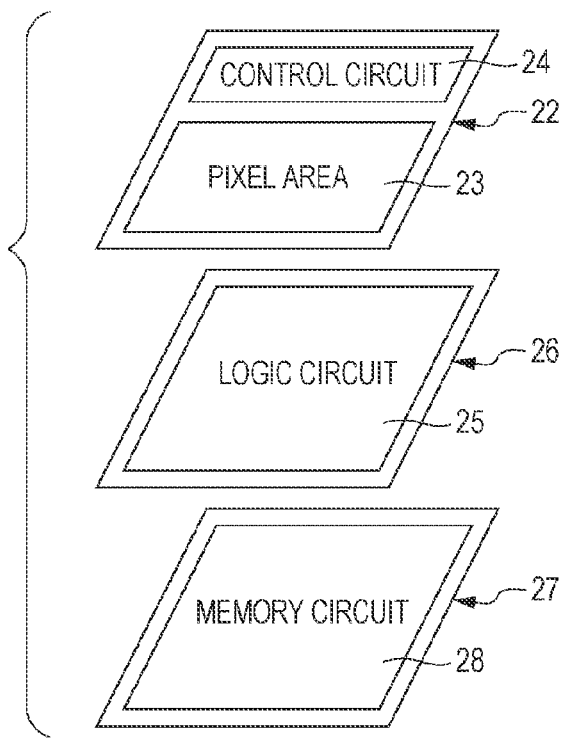
FIGS. 3A and 3B illustrate basic schematic configurations of the solid-state imaging device according to another embodiment of the present technology.
Figure 3B:
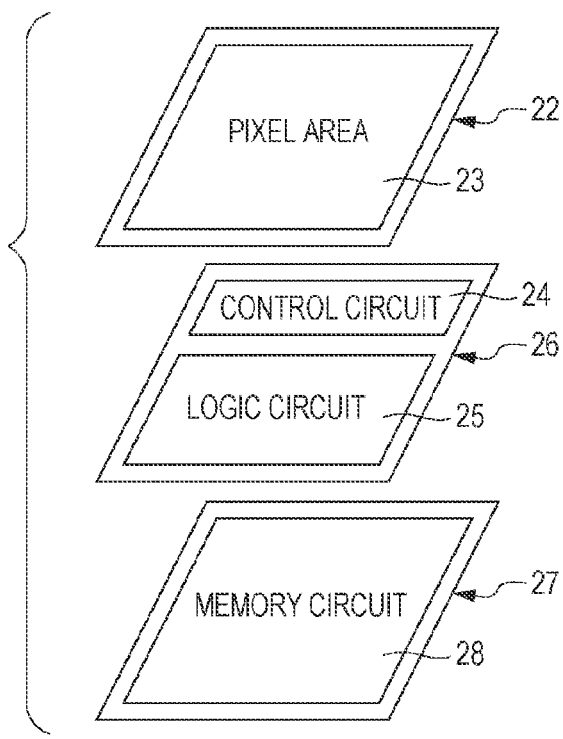

In addition, the configuration of the solid-state imaging device is not limited to FIGS. 3B and 3C, and for example, a portion of the control circuit 24 (for example, the vertical driving circuit 4, the horizontal driving circuit 6, and the control circuit 8) can be included in the first semiconductor chip unit 22, and the other portion of the control circuit 24 can be included in the second semiconductor chip unit 26. For example, the vertical driving circuit 4 and the horizontal driving circuit 6 may be included in the first semiconductor chip unit 22 as a portion, and the other portion may be included in the second semiconductor chip unit 26. Alternatively, only the vertical driving circuit 4 (or the horizontal driving circuit 6) may be included in the first semiconductor chip unit 22, and the others may be included in the second semiconductor chip unit 26. In addition, the second semiconductor chip unit 26 may include a memory circuit which stores a signal input to the pixel area, data resulting from the signal processing, or the like. For example, the second semiconductor chip unit 26 may include both the logic circuit 25 and the memory circuit.

In addition, as illustrated in FIGS. 3A and 3B, the solid-state imaging device according to the embodiment of the present technology can be configured as one semiconductor chip by electrically connecting the semiconductor chip units of three layers.

That is, as illustrated in FIG. 3A, the solid-state imaging device according to the embodiment of the present technology includes the pixel area 23 and the control circuit 24 in the first semiconductor chip unit 22, and includes the logic circuit 25 including the signal processing circuit for signal processing in the second semiconductor chip unit 26. Furthermore, as illustrated in FIG. 3A, the solid-state imaging device includes the memory circuit 28 which stores the signal input to the pixel area, the data resulting from the signal processing, or the like in a third semiconductor chip unit 27.

Alternatively, in addition, as illustrated in FIG. 3B, the solid-state imaging device according to the embodiment of the present technology includes the pixel area 23 in the first semiconductor chip unit 22, and includes the control circuit 24 and the logic circuit 25 including the signal processing circuit in the second semiconductor chip unit 26. Furthermore, as illustrated in FIG. 3B, the solid-state imaging device includes a memory circuit 28 in the third semiconductor chip unit 27.

Then, by electrically connecting the first semiconductor chip unit 22, the second semiconductor chip unit 26, and the third semiconductor chip unit 27, the solid-state imaging device is configured as one semiconductor chip.

In addition, the configuration of each unit included in the control area illustrated in FIGS. 3A and 3B, in the same manner as the configuration of the control area described above with reference to FIGS. 2A to 2C, can be made to include a portion of the control circuit 24 in the first semiconductor chip unit 22, and to include the other portion of the control circuit 24 in the second semiconductor chip unit 26. In addition, in the example of FIGS. 3A and 3B, the memory circuit may be included in the second semiconductor chip unit 26. In addition, the logic circuit may be included in the third semiconductor chip unit 27. For example, the second semiconductor chip unit 26 or the third semiconductor chip unit 27 may include both the logic circuit 25 and the memory circuit.

As described above, the solid-state imaging device according to the embodiment of the present technology is configured by stacking the semiconductor chips (semiconductor substrates). In addition, hereinafter, the examples in which the semiconductor chips are stacked with two layers and the semiconductor chips are stacked with three layers are described, but are not limited to the two layers or three layers, and may be stacked with four layers, five layers, or more.

Next, a manufacturing method of the solid-state imaging device which is configured by stacking the semiconductor substrates will be described.

1. First Embodiment

Configuration Example of Semiconductor Chip

Figure 4A:
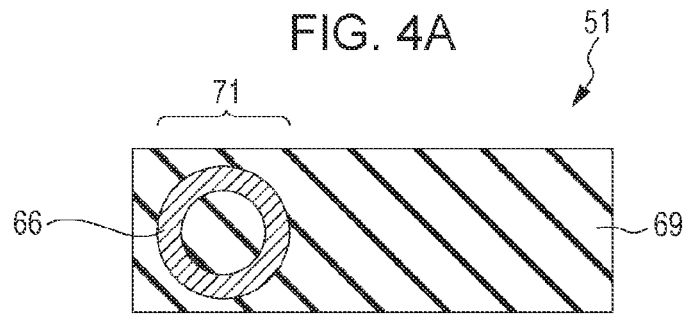
FIGS. 4A to 4C are views illustrating configuration examples of a semiconductor chip stacked on a solid-state imaging device according to a first embodiment of the present technology.
Figure 4B:
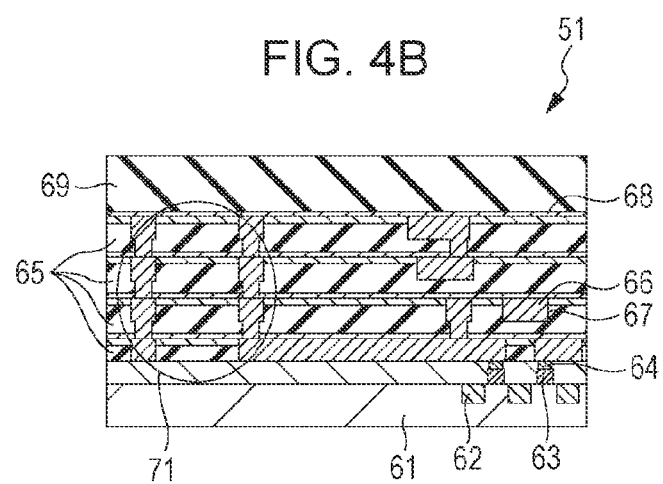
Figure 4C:
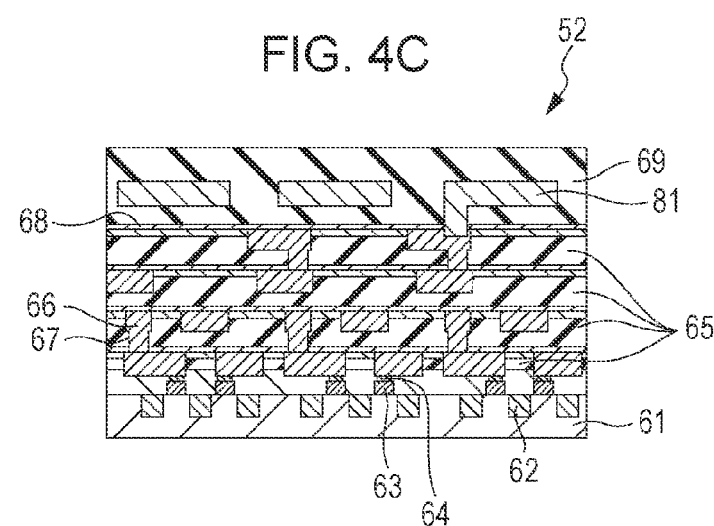

FIGS. 4A to 4C are views illustrating configuration examples of a semiconductor chip (semiconductor substrate) stacked on a solid-state imaging device according to a first embodiment of the present technology. FIG. 4A is a top view in which an upper semiconductor chip (hereinafter, referred to as a chip) 51 is viewed from top, FIG. 4B is a side view of the upper chip 51, and FIG. 4C is a side view of a lower chip 52. In addition, in the examples of FIGS. 4A to 4C, not all the units have symbols or reference numerals, but the portions having the same hatching are represented by the same symbols or reference numerals, and this is applied to the following description in the same manner as above.

As a first embodiment, the upper chip 51 and the lower chip 52 which are chips including logic circuits having signal processing circuits will be first described.

As illustrated in FIG. 4B, the upper chip 51 includes an element separation member 62, a gate 63, and a contact member 64 which are formed in an Si substrate unit 61, and after the upper chip 51 is planarized, four wiring layers are formed thereon. The four wiring layers are interlayer insulating films, use low-dielectric rate insulating films (hereinafter, referred to as Low-k insulating films) 65, use wiring metal (for example, Cu) 66 as a wire and a via, and further use barrier metal (for example, Ta or TaN) 67 for the wiring metal 66. A diffusion barrier film (for example, SiCN) 68 is used between the wiring layers, and an insulating film (for example, SiO2) 69 is formed on the wiring layer.

For example, a porous SiOC film, a porous Hydrogen Silsesquioxane (HSQ) film, and a porous Methyl Silsesquioxane (MSQ) film are representatively used as Low-k materials. In such Low-k materials, film components including porogen are first deposited by a CVD method or a coating method, and thereafter, the porogen is formed by being separated from the film components by UV curing, plasma curing, thermal processing, and curing performed by an electron beam. Thus, not only a plurality of holes which are originally provided in each film and have small average diameter, but also a plurality of holes which are formed by the separated porogen and have large average diameter, are included in such a porous SiOC film, a porous HSQ film, and a porous MSQ film.

As a result, the Low-k insulating film is weaker than SiO2 or the like, and if the Low-k insulating film is used as an interlayer insulating film, the Low-k insulating film retreats at the time of plasma etching or cleaning, and abnormality of a processed shape occurs.

Therefore, when the upper chip 51 including a wiring layer having at least one Low-k interlayer insulating film 65 is formed, the guard ring 71 is formed by placing the wires of each wiring layer and the vias in a vertical structure (in series) so as to be in contact with the through electrode, in the portion in which the through electrode for electrically and mutually connecting to the lower chip 52 is formed. As illustrated in FIG. 4A, the guard ring 71 is formed in a circle when viewed from the top. In addition, hereinafter, a portion in which the through electrode is formed is referred to as a through electrode forming portion.

In FIG. 4B, the guard ring 71 is electrically connected to a wire on an element side in a first layer when viewed from the bottom. It is preferable that a diameter of the guard ring 71 be, for example, 1 um to 5 um, and a wiring width be, for example, 50 nm to 500 nm. It is preferable that, since the guard ring 71 is formed at the same time as the wire, the material of the guard ring 71 be the same as a general wiring material (for example, Cu or Al), or a barrier material (for example, Ta, Ti, TiN, or TaN).

As illustrated in FIG. 4C, the lower chip 52 is different from the upper chip 51 in that the position, the number, and the like of the wire or the element separation member 62, the gate 63, and the contact member 64 are different, the guard ring 71 is not formed, and the pads 81 are formed. In contrast, the other basic configurations of the lower chip 52 are the same as those of the upper chip 51 described above.

That is, in the lower chip 52, the element separation member 62, the gate 63, and the contact member 64 are formed in the Si substrate unit 61, and after being planarized, four wiring layers are formed. The four wiring layers use the Low-k insulating film 65 as an interlayer insulating film, and use the wiring metal 66 as a wire and a via, and further use the barrier metal 67 for the wiring metal 66. A diffusion barrier film is used for each wiring interlayer, and on the wiring layer, pads are provided and the insulating film 69 is formed.

The reversed upper chip 51 is bonded on such a lower chip 52, and the through electrode is formed inside the guard ring 71 of the upper chip 51, and thereby the solid-state imaging device is configured.

Manufacturing Processing of Solid-State Imaging Device

Next, with reference to the flow charts of FIGS. 5 and 6, and the process diagrams of FIGS. 7A to 9B, manufacturing processing of a solid-state imaging device in which the two semiconductor chips illustrated in FIGS. 4A to 4C are stacked will be described. In addition, such processing is performed by a manufacturing device which manufactures the solid-state imaging device.

Figure 5:
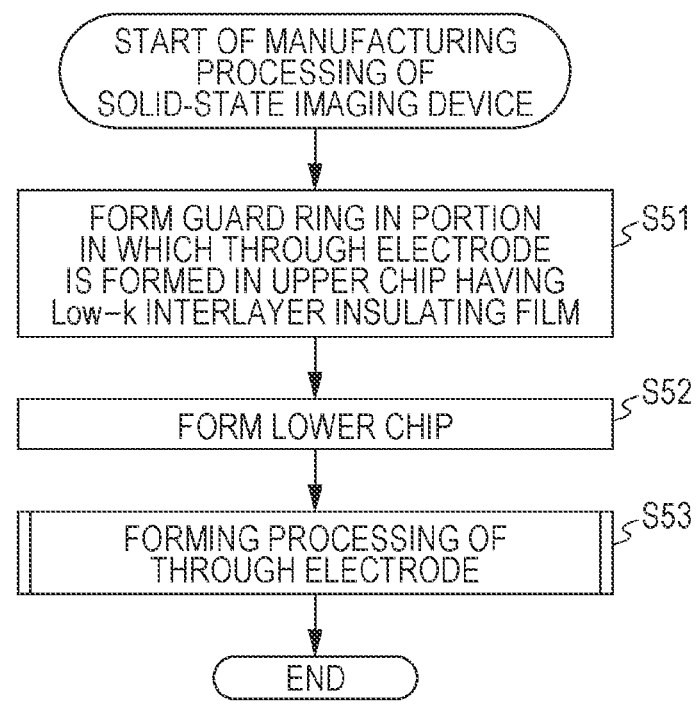
FIG. 5 is a flow chart for explaining manufacturing processing of a solid-state imaging device.

First, in step S51 of FIG. 5, as illustrated in FIG. 4B described above, the manufacturing device forms the guard ring 71 in a portion in which the through electrode of the upper chip 51 including the Low-k interlayer insulating film 65 is formed.

In step S52, the manufacturing device forms another chip (the lower chip 52 illustrated in FIG. 4C described above) which is bonded to the upper chip 51 by the through electrode. In addition, a forming method of the lower chip 52 is the same as the forming method of the semiconductor chip of the related art.

In step S53, the manufacturing device performs forming processing of the through electrode. Such forming processing of the through electrode will be described with reference to the flow chart of FIG. 6.

In step S71, the manufacturing device bonds the reversed upper chip 51 to the lower chip 52 and performs lithography in the portion in which the through electrode is formed in the upper chip 51.

Figure 7A:
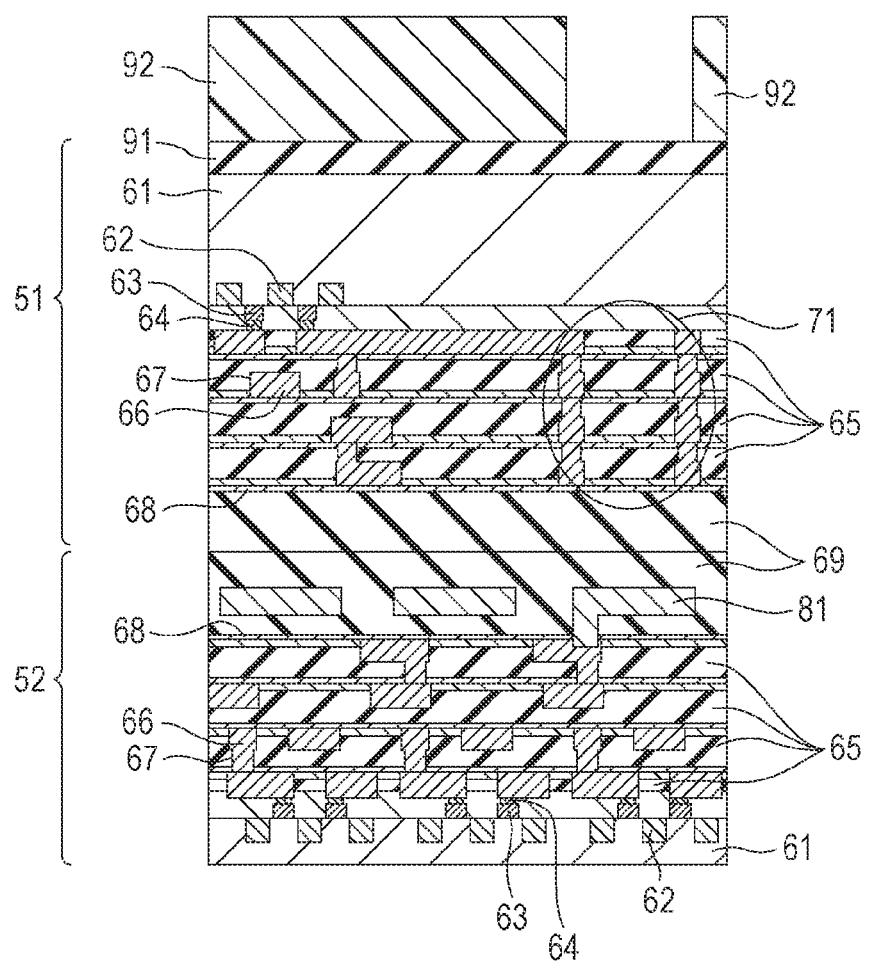
FIGS. 7A to 7C are views illustrating a manufacturing process of a solid-state imaging device.

That is, as illustrated in FIG. 7A, an insulating film (for example, SiO2) 91 is formed on the substrate of the reversed upper chip 51, and thereon, a resist 92 is formed in a portion other than the portion in which the through electrode is formed, and lithography is performed. In addition, as illustrated in FIG. 7A, the resist 92 is hung over the guard ring 71 so as to be able to be in contact with the guard ring 71 from the rear.

Figure 7B:
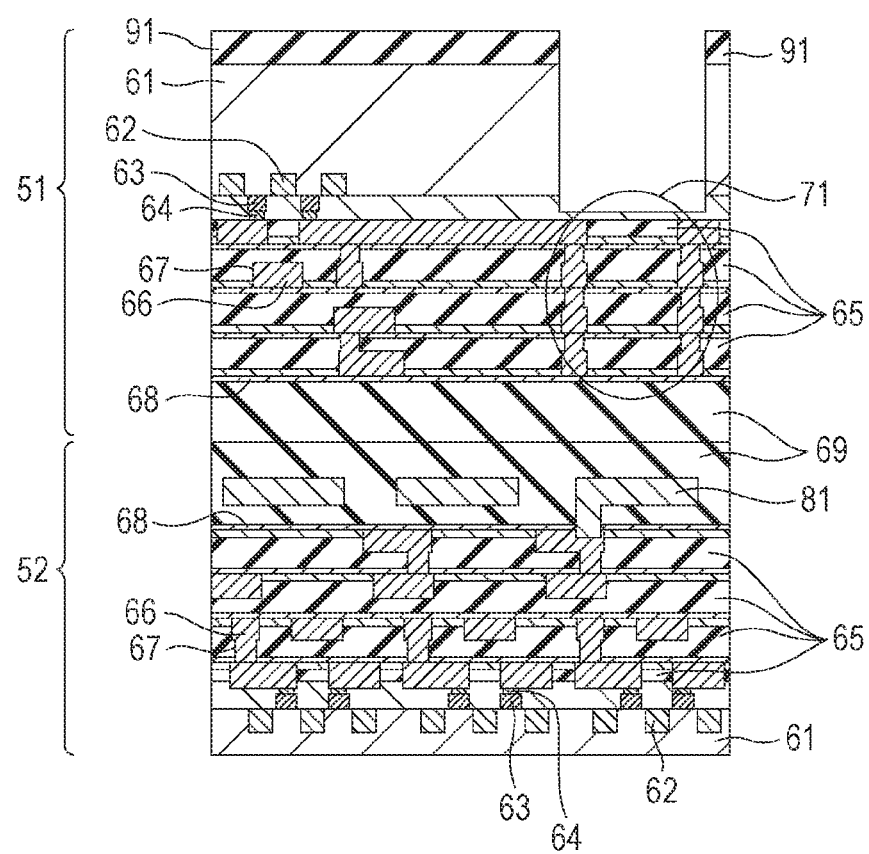

In step S72, as illustrated in FIG. 7B, the manufacturing device performs plasma etching until right before the wiring metal is exposed, and thereafter, removes the resist 92.

Figure 7C:
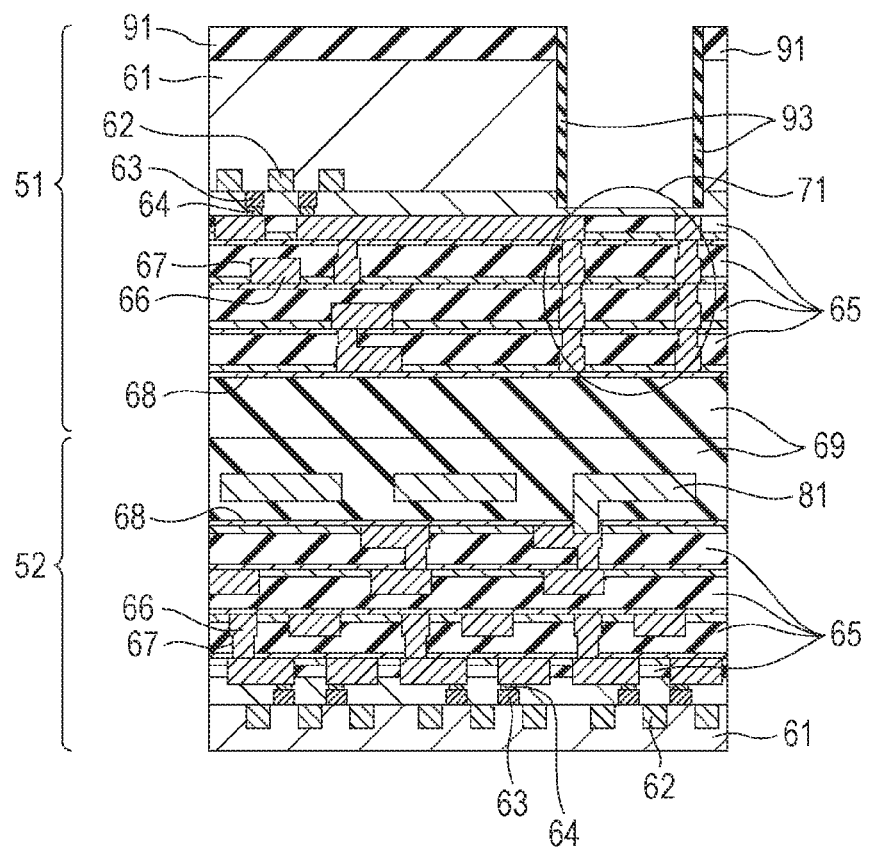

In step S73, as illustrated in FIG. 7C, the manufacturing device forms an insulating film 93 which insulates the Si substrate unit 61 and the through electrode. For example, the insulating film 93 with SiO2 of 100 nm to 400 nm is formed.

Figure 8A:
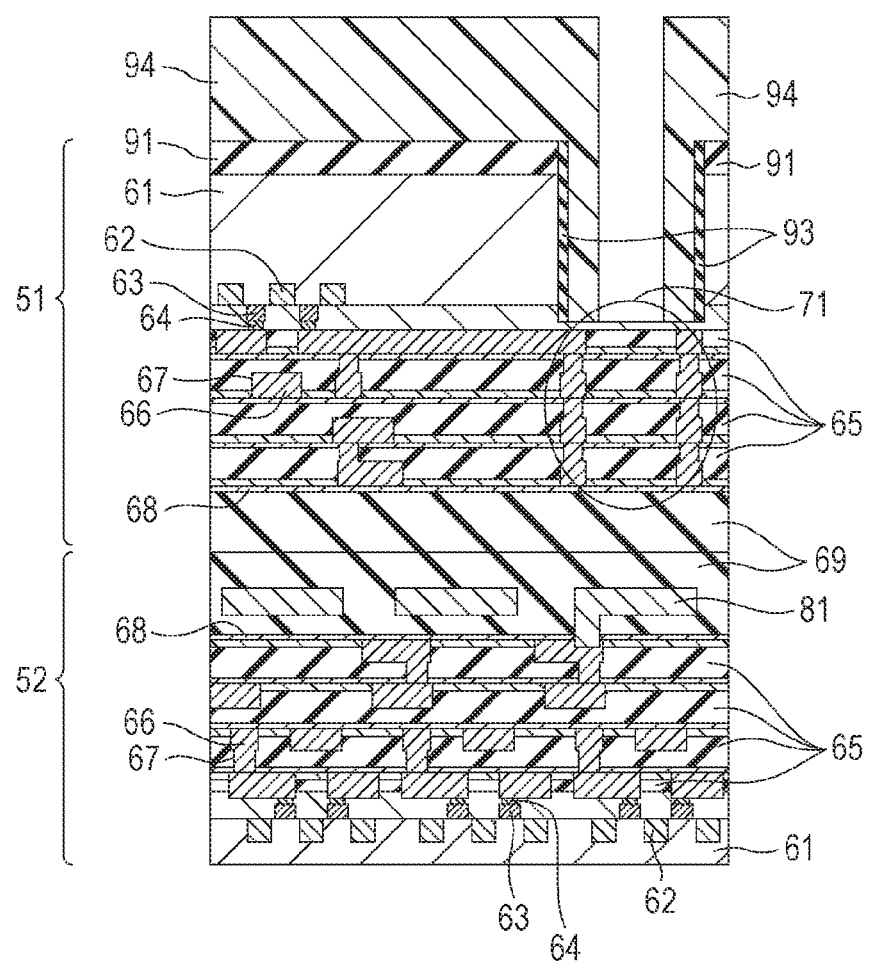
FIGS. 8A and 8B are views illustrating a manufacturing process of a solid-state imaging device.

In step S74, as illustrated in FIG. 8A, the manufacturing device forms a resist 94 in such a manner that a through hole 95 (FIG. 8B) can be formed up to a pad 81 of the lower chip 52, without exposing the wiring metal, and performs lithography.

Figure 8B:
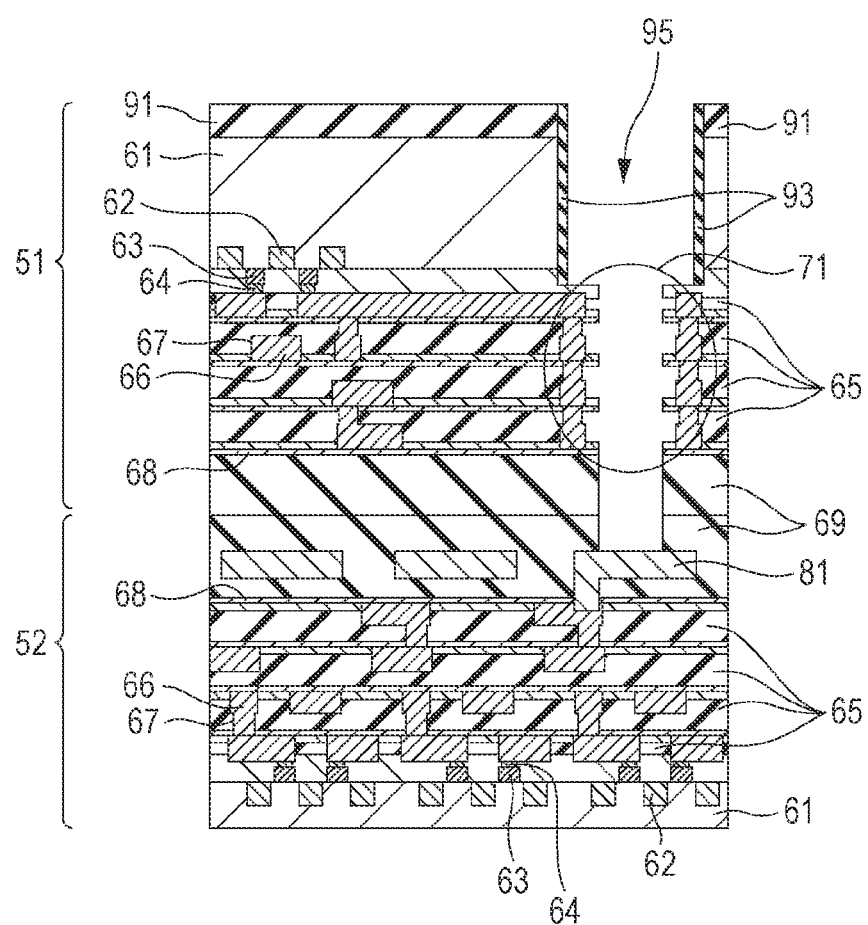

In step S75, as illustrated in FIG. 8B, the manufacturing device forms the through hole 95 up to the pad 81 of the lower chip 52 using the plasma etching, and thereafter, removes the resist 94. At this time, the Low-k insulating film 65 in the guard ring 71 retreats or disappears.

Figure 9A:
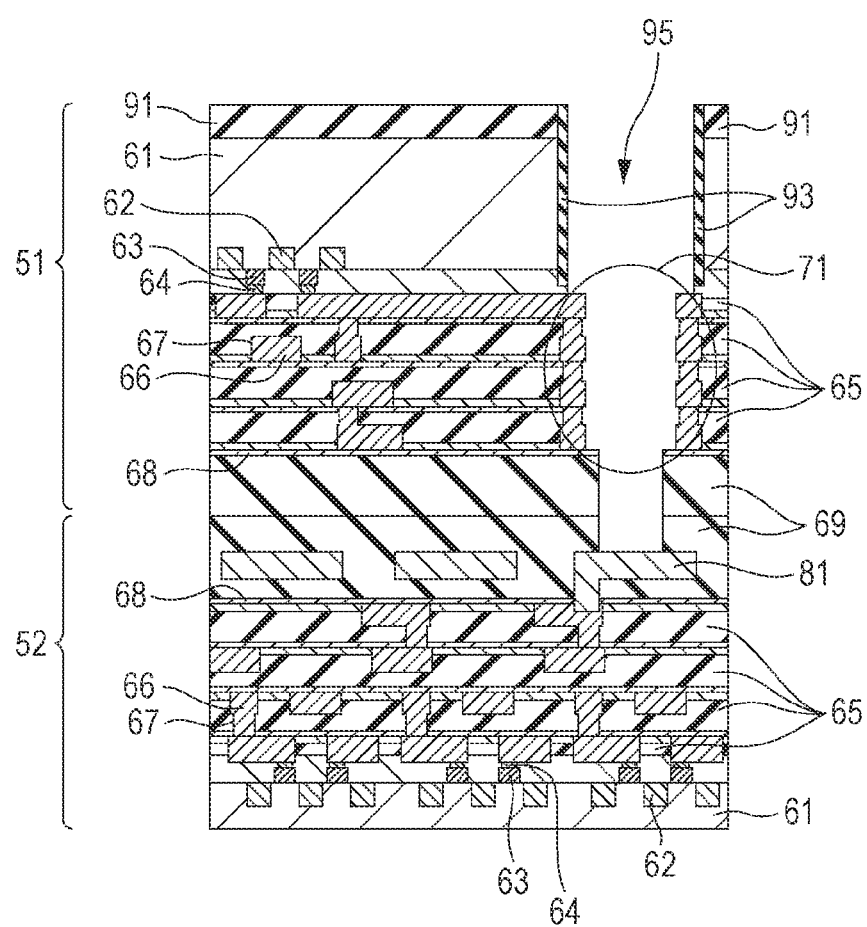
FIGS. 9A and 9B are views illustrating a manufacturing process of a solid-state imaging device.

In step S76, as illustrated in FIG. 9A, the manufacturing device exposes a wiring layer of the upper chip 51 in the guard ring 71 using the plasma etching. In addition, as illustrated in FIG. 8B, after the Low-k insulating film 65 retreats in step S75, the diffusion barrier film remains on a side of the through hole 95, thereby becoming uneven. Thus, by the plasma etching in step S76, the wiring layer of the upper chip 51 is exposed, the diffusion barrier film remaining on the side of the through hole in step S75 is removed, and thereby the side is planarized, as illustrated in FIG. 9A.

Figure 9B:
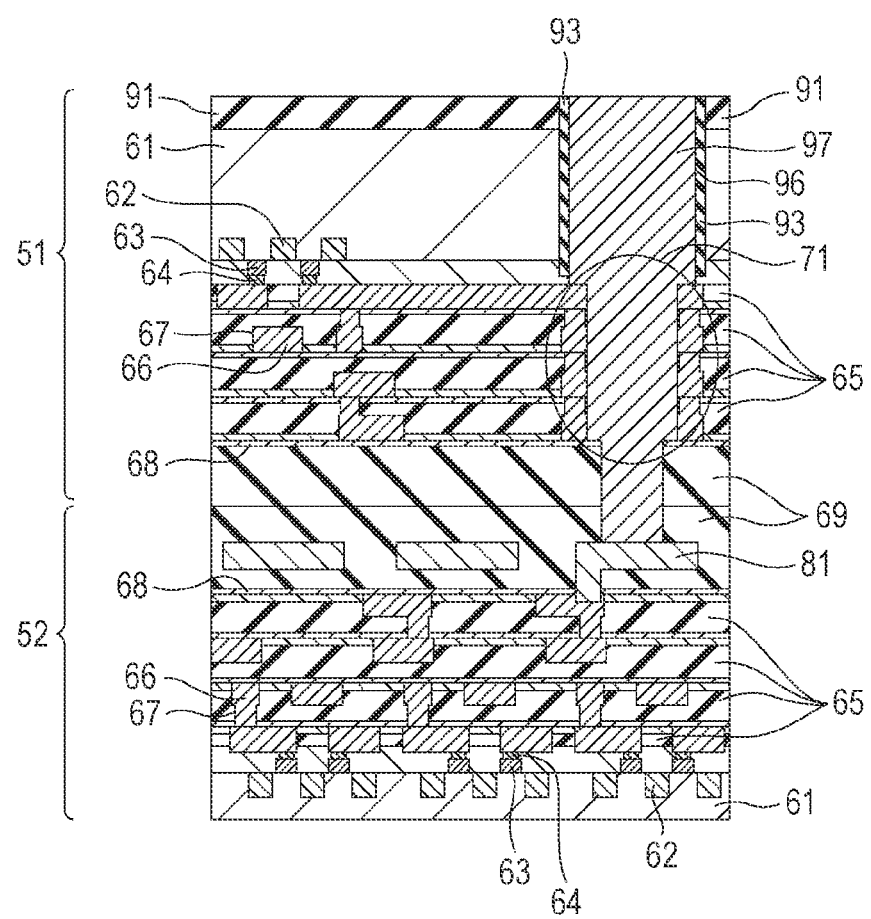

In step S77, as illustrated in FIG. 9B, the manufacturing device forms a film in the through hole 95 using a barrier metal 96, buries metal, and then forms the through electrode 97 inside the guard ring 71. As described above, the reversed upper chip 51 is bonded on the lower chip 52, the through electrode is formed inside the guard ring 71 formed in the wiring layer including the Low-k interlayer insulating film of the upper chip 51, and the semiconductor device in which two semiconductor chips are stacked is manufactured.

As described above, when the through electrode is formed using the guard ring, the Low-k interlayer insulating film is shielded almost completely from plasma, cleaning chemical liquid, and the atmosphere. As a result, even if the through electrode passes through the Low-k interlayer insulating film, abnormality of the processed shape caused by retreat of the Low-k insulating film almost disappears. Thus, it is possible to decrease film failure occurring when the film of the barrier metal is formed, or a void occurring when the wire is buried, or the like, and to improve decrease of a failure rate or reliability.

In addition, when the through hole is formed, it is possible to prevent the Low-k interlayer insulating film from absorbing moisture while in the atmosphere or at the time of cleaning. As a result, it is possible to decrease characteristic degradation and failure of the semiconductor elements caused by Low-k alteration.

2. Second Embodiment

Manufacturing Processing of Solid-State Imaging Device

Figure 10:
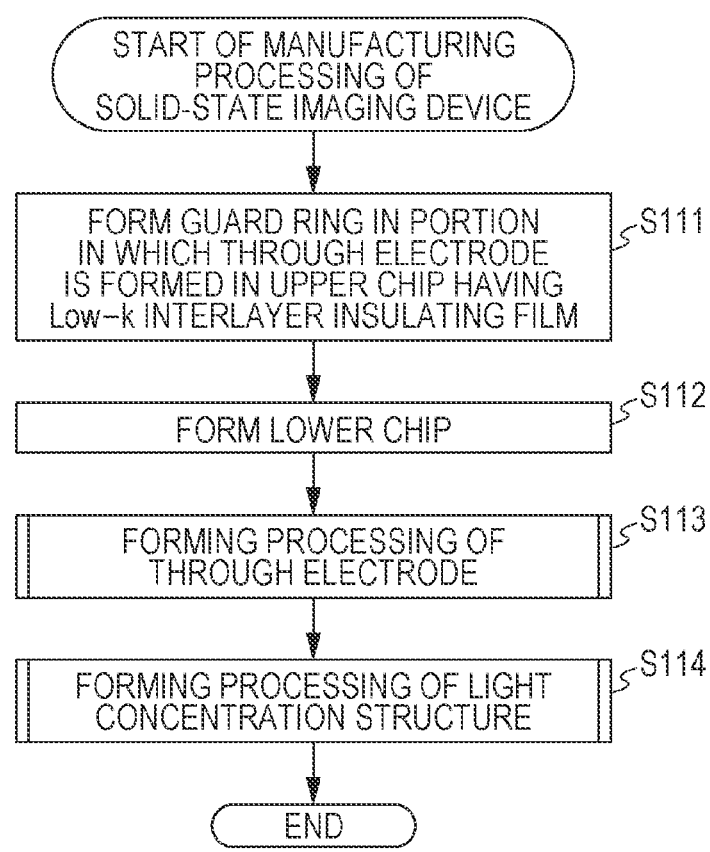
FIG. 10 is a flow chart for explaining manufacturing processing of a solid-state imaging device according to a second embodiment of the present technology.
Figure 11:
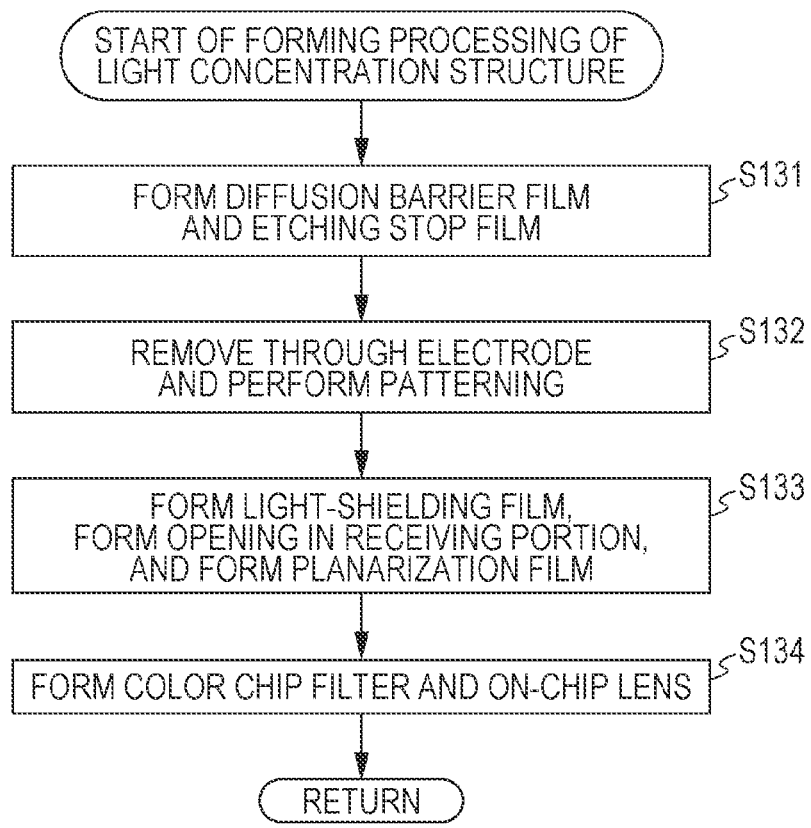
FIG. 11 is a flow chart for explaining forming processing of a light concentration structure.

Next, with reference to the flow charts of FIGS. 10 and 11, and the process diagrams of FIGS. 12A to 13B, manufacturing processing of a solid-state imaging device in which both a semiconductor chip having an imaging element (that is, CIS: Contact Image Sensor) and a semiconductor chip having the logic circuit are stacked will be described. In addition, in such an example, an example of back-illuminated type imaging element is illustrated as an imaging element, for example.

Figure 12A:
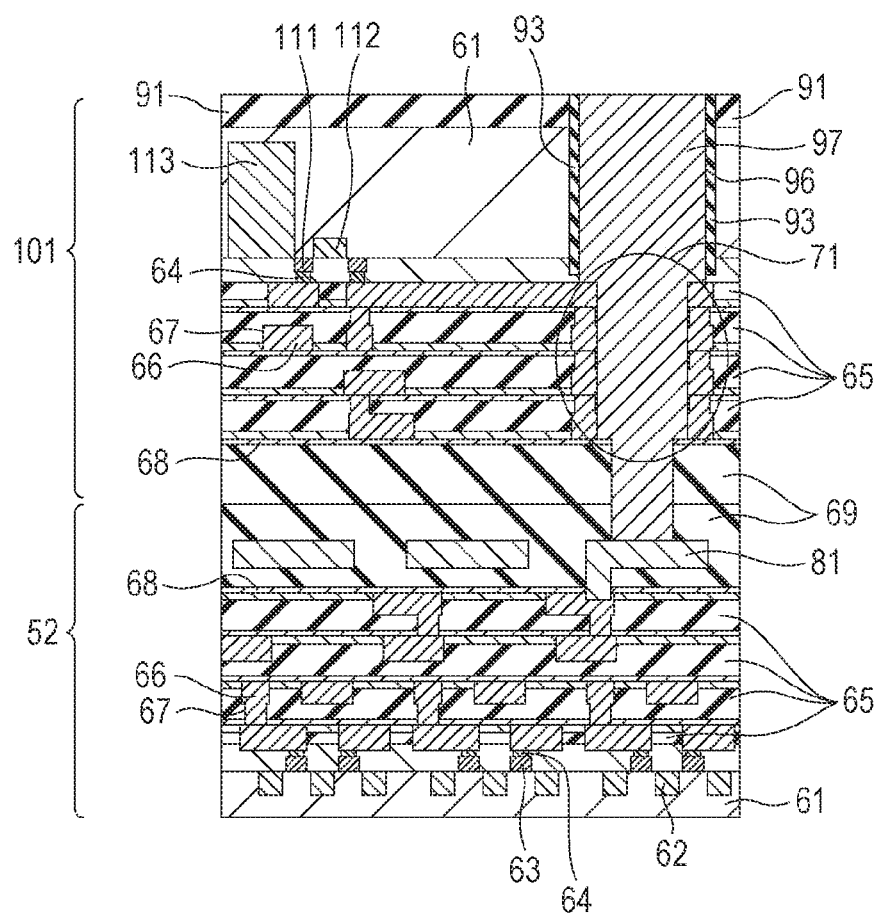
FIGS. 12A and 12B are views illustrating a manufacturing process of a solid-state imaging device.

In step S111 of FIG. 10, as illustrated in FIG. 12A, the manufacturing device forms the guard ring 71 in a portion in which a through electrode of an upper chip 101 including the Low-k interlayer insulating film 65 is formed.

In step S112, the manufacturing device forms another chip (the lower chip 52 illustrated in FIG. 4C described above) which is bonded to the upper chip 101 by the through electrode.

In step S113, the manufacturing device performs forming processing of the through electrode. In addition, the upper chip 101 is simply different from the upper chip 51 in that the gate 63 is replaced with a transfer gate 111, the element separation member 62 is replaced with a field diffusion member 112, and a photoelectric conversion unit 113 is added.

That is, in the upper chip 101, the photoelectric conversion unit 113, the field diffusion member 112, the transfer gate 111, and the contact member 64 are formed in the Si substrate unit 61, the upper chip 101 is planarized, and thereafter, four wiring layers are formed. The four wiring layers use the Low-k insulating film 65 as an interlayer insulating film and use the wiring metal 66 as the wire and the via, and furthermore, the barrier metal 67 is used for the wiring metal 66. The diffusion barrier film is used between the wiring layers, and the insulating film 69 is formed beneath the wiring layer.

Thus, since the forming processing of the through electrode of step S113 is basically the same as the processing described above with reference to FIG. 6, description thereof will not be repeated.

In step S113, the reversed upper chip 101 is bonded on the lower chip 52, and the through electrode 97 is formed inside the guard ring 71 of the upper chip 101.

In step S114, the manufacturing device performs the forming processing of a light concentration structure. The forming processing of the light concentration structure will be described with reference to the flow chart of FIG. 11.

Figure 12B:
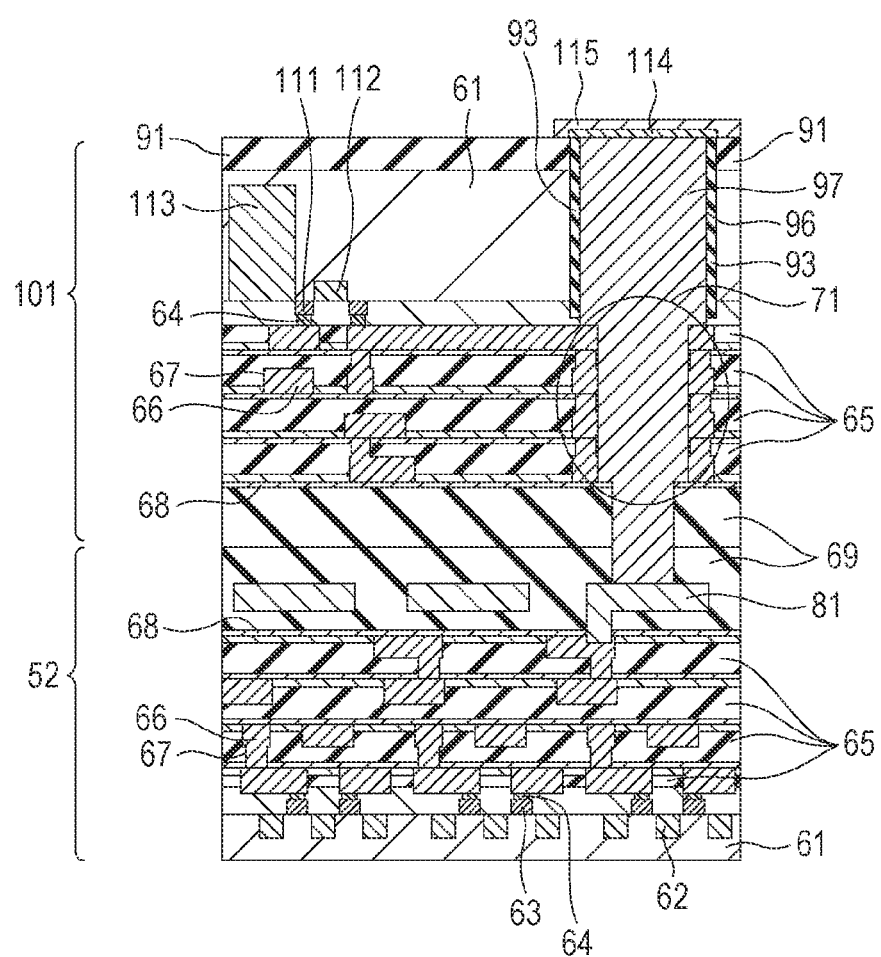

In step S131, as illustrated in FIG. 12B, the manufacturing device forms a diffusion barrier film 114 with respect to the through electrode 97, and an etching stop film 115.

In step S132, the manufacturing device performs patterning except on the through electrode 97.

Figure 13A:
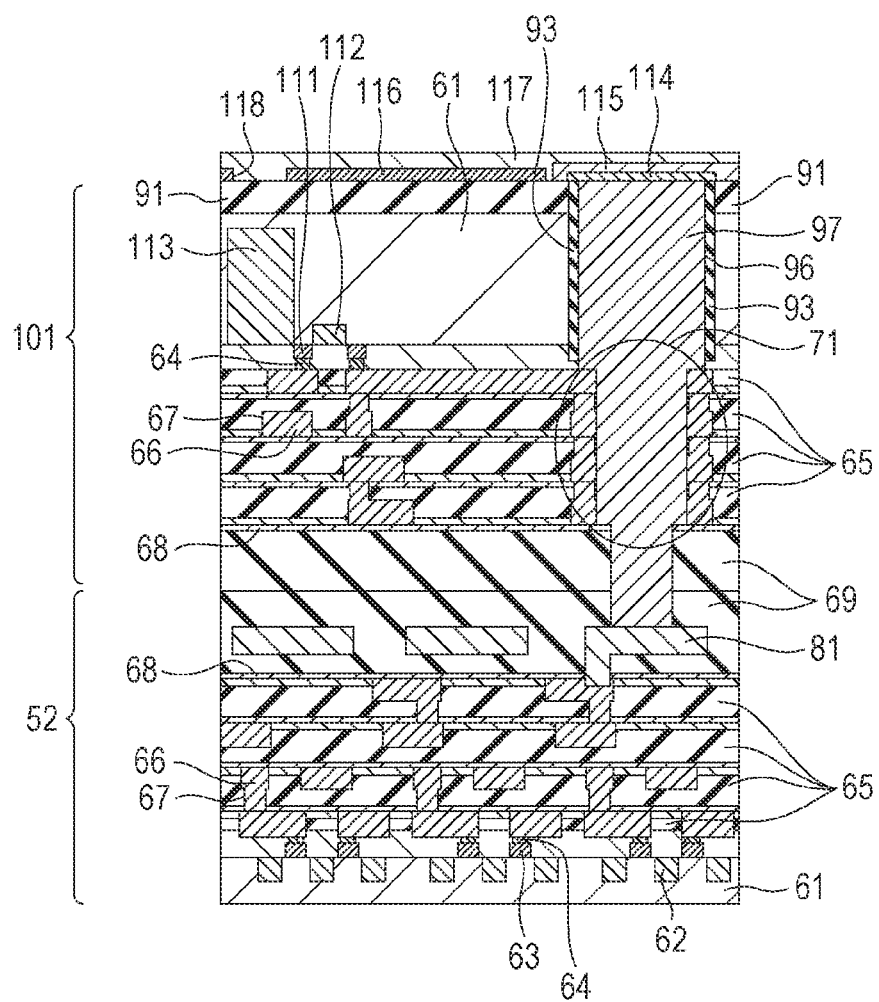
FIGS. 13A and 13B are views illustrating a manufacturing process of a solid-state imaging device.

In step S133, as illustrated in FIG. 13A, the manufacturing device forms a light-shielding film (material: Al or W)

116 in addition to the through electrode 97, forms an opening 118 in a receiving portion, and thereafter, forms a planarization film 117.

Figure 13B:
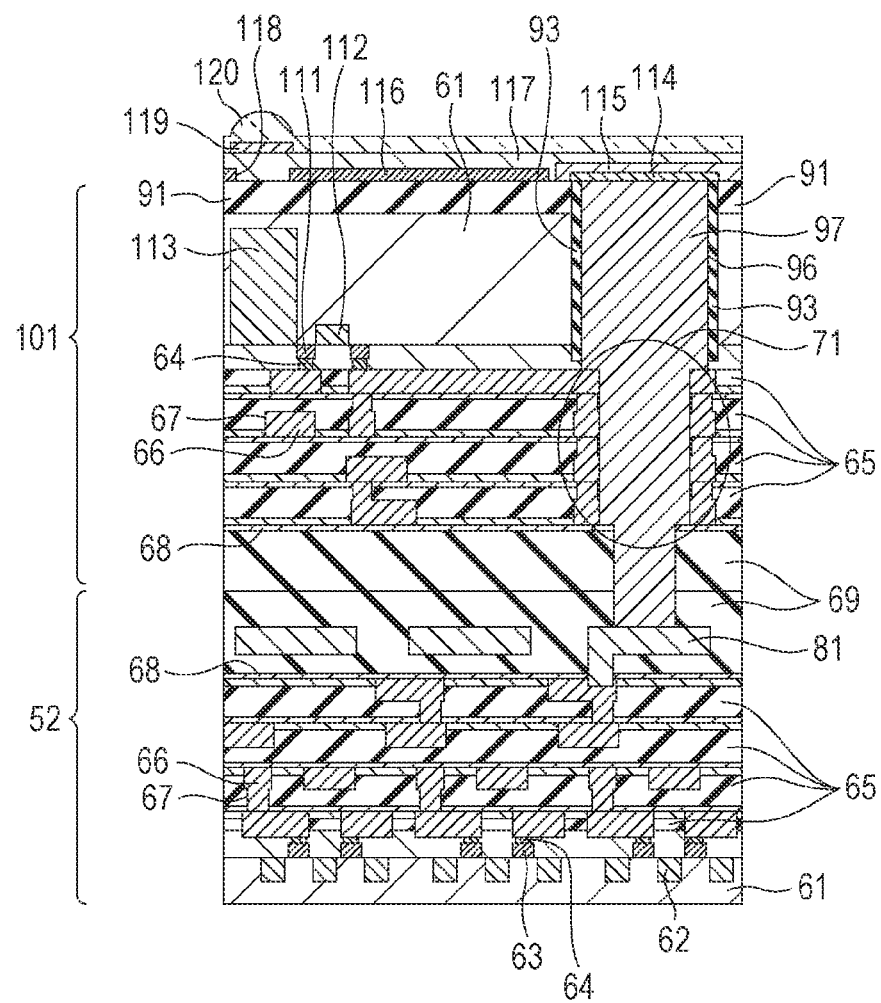

In step S134, as illustrated in FIG. 13B, the manufacturing device forms a color filter 119 and an on-chip lens 120.

As described above, the reversed upper chip 101 is bonded on the lower chip 52, the through electrode is formed inside the guard ring 71 of the upper chip 101, and the solid-state imaging device in which a semiconductor chip including an imaging element and another semiconductor chip including a logic chip are stacked is manufactured.

In addition, in the above description, as an example in which two semiconductor chips are stacked, examples are described in which a semiconductor device having stacked semiconductor chips including two logic circuits, and a semiconductor device having both a semiconductor chip including an imaging element and a semiconductor chip including a logic circuit are stacked. However, the configurations or the stack sequence of the semiconductor chips which are stacked in the semiconductor device are not limited thereto. For example, the present technology is applied to a semiconductor device in which a semiconductor chip including an imaging element and a semiconductor chip including a memory circuit are stacked, or to a semiconductor device in which both a semiconductor chip including a logic circuit and a semiconductor chip including a memory circuit are stacked.

3. Third Embodiment

Manufacturing Processing of Solid-State Imaging Device

Next, with reference to the flow chart of FIG. 14 and the process diagrams of FIGS. 12A to 13B, manufacturing processing of a solid-state imaging device in which a semiconductor chip having an imaging element and two semiconductor chips having a logic circuit are stacked will be described.

In step S151 of FIG. 14, as illustrated in FIG. 4B described above, the manufacturing device forms the guard ring 71 in a portion in which the through electrode of the upper chip 101 including the Low-k interlayer insulating film 65 is formed.

In step S152, the manufacturing device forms another chip (the lower chip 52 illustrated in FIG. 4C described above) which is bonded to the upper chip 101 by the through electrode.

Figure 15A:
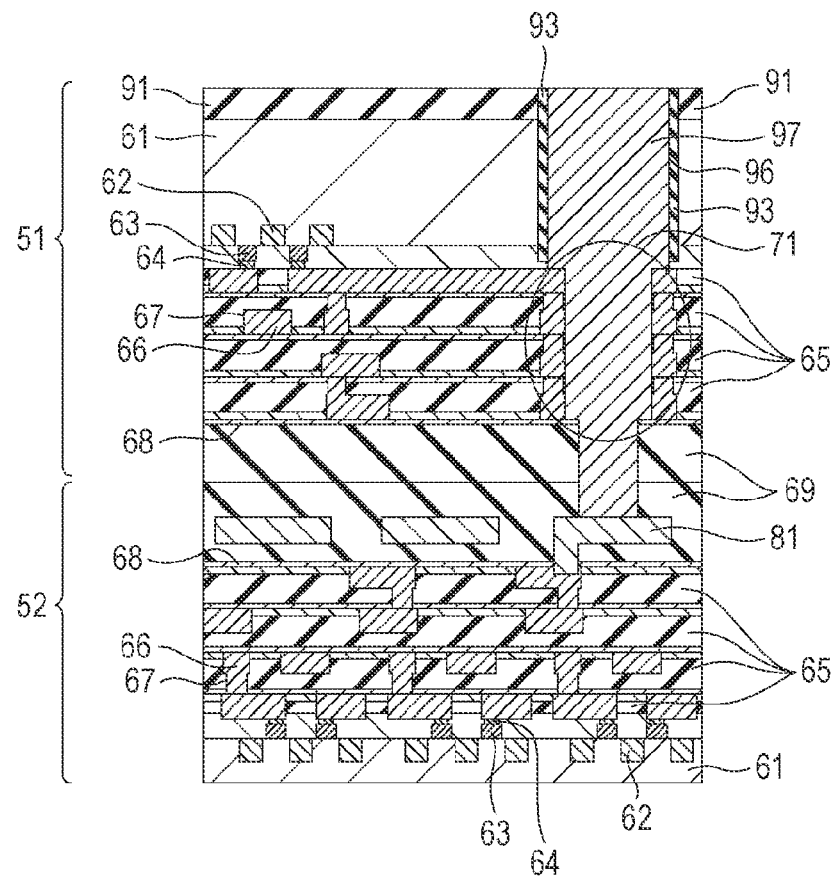
FIGS. 15A and 15B are views illustrating a manufacturing process of a solid-state imaging device.

In step S153, the manufacturing device performs the forming processing of the through electrode described above with reference to FIG. 6. In step S153, as illustrated in FIG. 15A, the reversed upper chip 51 is bonded on the lower chip 52, and the through electrode 97 is formed inside the guard ring 71 of the upper chip 51.

In step S154, the manufacturing device forms a top chip 151 up to the wire. The top chip 151 is a chip which includes, for example, a back-illuminated type imaging element.

Figure 15B:
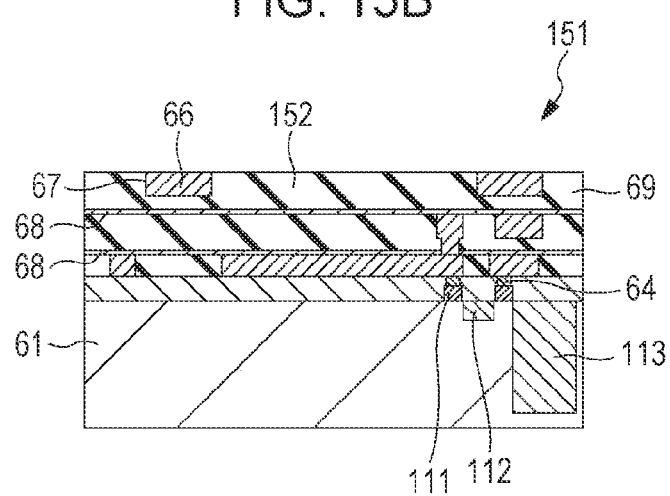

As illustrated in FIG. 15B, the top chip 151 is different from the upper chip 101 in that wiring layers have three layers, not four layers, and in addition, an Si oxide film 152 is used for the wiring layers instead of the Low-k insulating film 65 as an interlayer insulating film. That is, the Low-k insulating film is not used for the top chip 151.

Thus, in the top chip 151, the photoelectric conversion unit 113, the field diffusion member 112, the transfer gate 111, and the contact member 64 are formed in the Si substrate unit 61, the top chip 151 is planarized, and thereafter, three wiring layers are formed. The three wiring layers use the Si oxide film 152 as the interlayer insulating film and use the wiring metal 66 as the wire and the via, and furthermore, the barrier metal 67 is used for the wiring metal 66. In addition, there are wires in a position which is in contact with the through electrode 97 on a layer of a bonding side of the top chip 151. The diffusion barrier film is used between the wiring layers.

In step S155, the manufacturing device bonds the reversed top chip 151 to a chip in which the upper chip 51 and the lower chip 52 are stacked.

In addition, such bonding is done by bonding wafers which are in states where, for example, the existing Cu wire and SiO2 film are mixed.

Figure 16A:
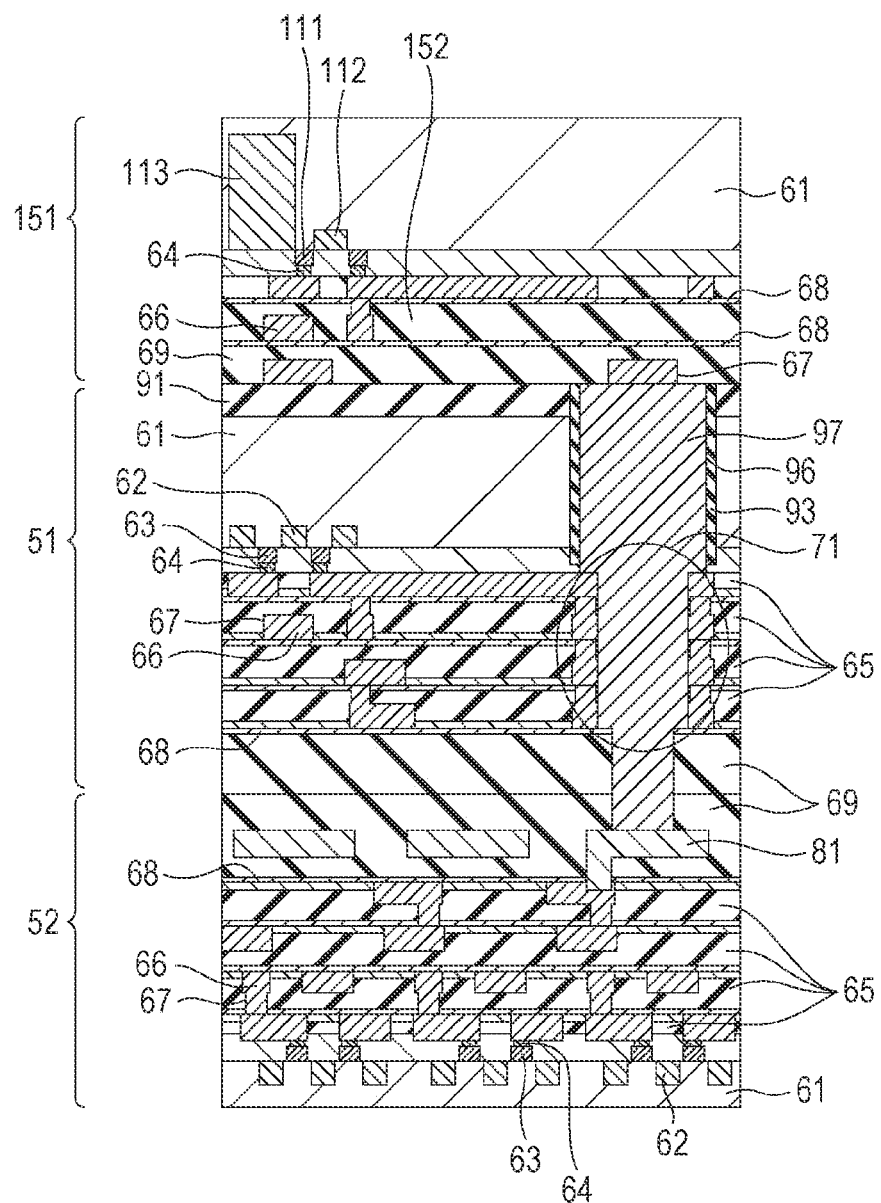
FIGS. 16A and 16B are views illustrating a manufacturing process of a solid-state imaging device.
Figure 16B:
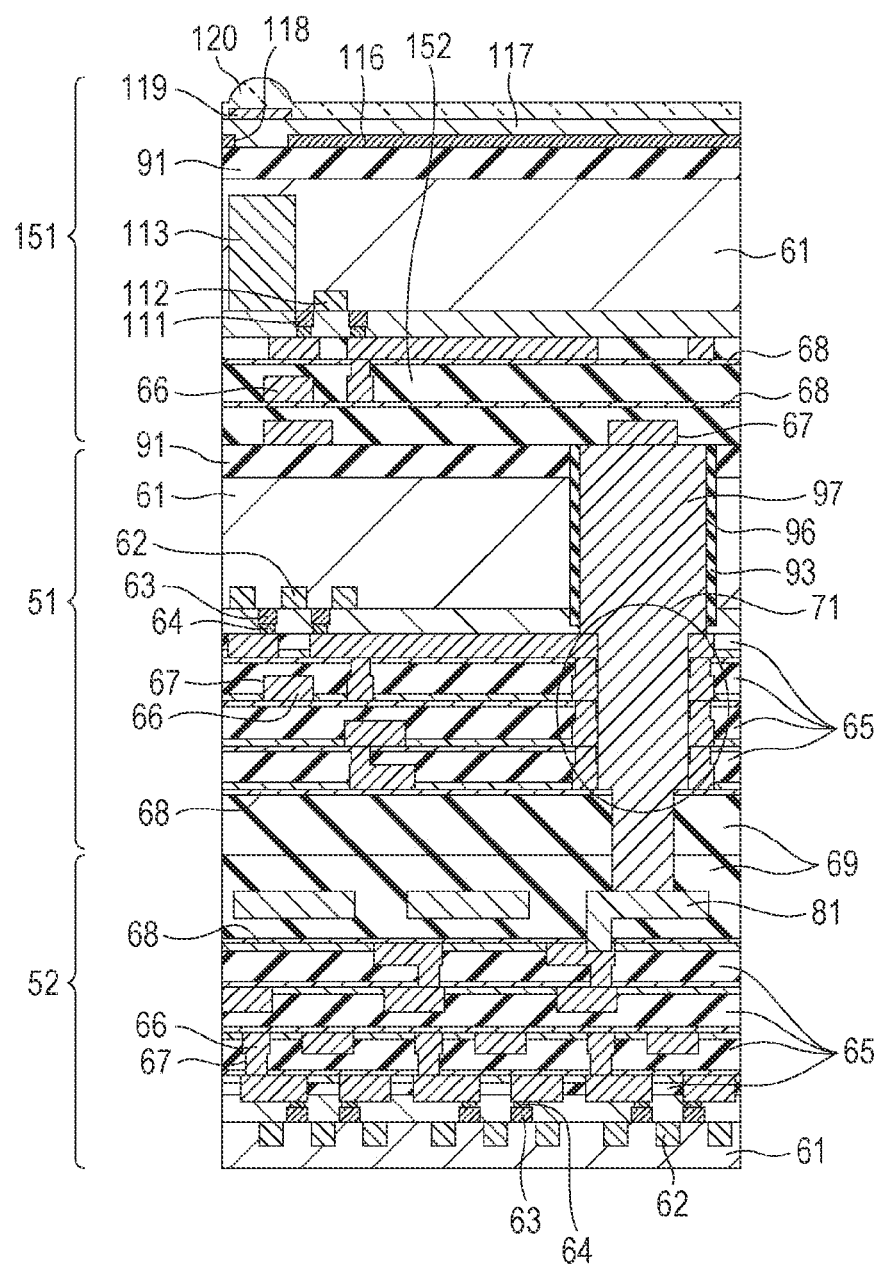

In step S156, as illustrated in FIG. 16B, the manufacturing device forms the insulating film (for example, SiO2) 91, forms the light-shielding film (material: Al or W) 116, forms the opening 118 of the light-receiving unit, and then forms the planarization film 117, on the Si substrate unit 61.

In step S157, the manufacturing device forms the color filter 119 and the on-chip lens 120 on the planarization film 117.

As described above, the reversed upper chip 51 is bonded on the lower chip 52, and the through electrode 97 is formed inside the guard ring 71 of the upper chip 51. As a result, a semiconductor chip including an imaging element and a semiconductor chip including a logic chip are stacked. Then, the semiconductor chip (the top chip 151) including the imaging element is further stacked on the stacked semiconductor chip, and thereby a solid-state imaging device is manufactured.

4. Fourth Embodiment

Manufacturing Processing of Solid-State Imaging Device

Next, with reference to the flow chart of FIG. 17, and the process diagrams of FIGS. 18A to 19B, another example of manufacturing processing of a solid-state imaging device in which a semiconductor chip having an imaging element two semiconductor chips having a logic circuit are stacked will be described.

Figure 17:
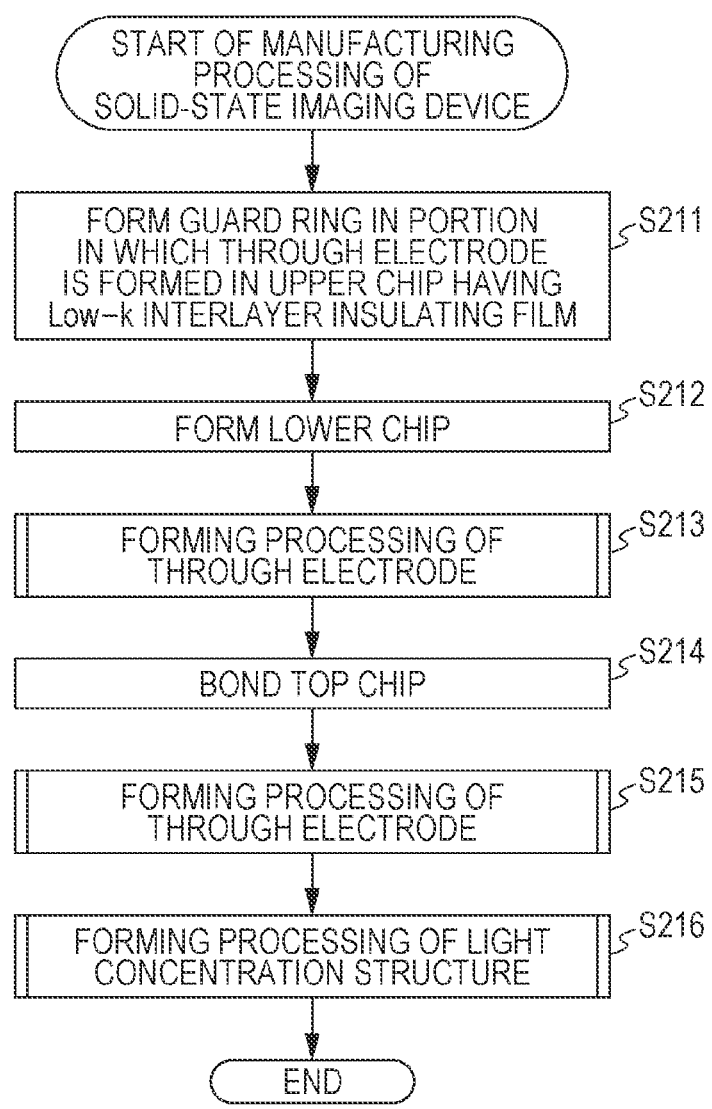
FIG. 17 is a flow chart for explaining manufacturing processing of a solid-state imaging device according to a fourth embodiment of the present technology.

In step S211 of FIG. 17, as illustrated in FIG. 4B described above, the manufacturing device forms the guard ring 71 in a portion in which the through electrode of the upper chip 51 including the Low-k interlayer insulating film 65 is formed.

In step S212, the manufacturing device forms another chip (the lower chip 52 illustrated in FIG. 4C described above) which is bonded to the upper chip 51 by the through electrode.

Figure 18A:
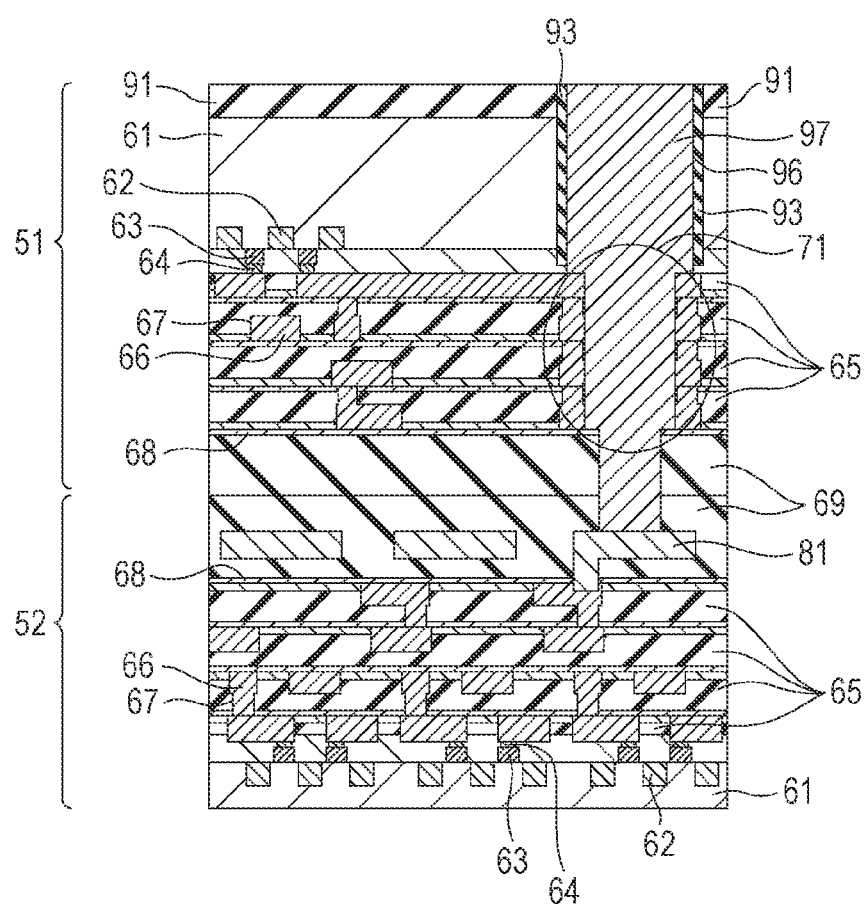
FIGS. 18A to 18C are views illustrating a manufacturing process of a solid-state imaging device.

In step S213, the manufacturing device performs the forming processing of the through electrode described above with reference to FIG. 6. In step S213, as illustrated in FIG. 18A, the reversed upper chip 51 is bonded on the lower chip 52, and the through electrode 97 is formed inside the guard ring 71 of the upper chip 51.

In step S214, the manufacturing device bonds a reversed top chip 201 which is formed by the existing method to a chip in which the upper chip 51 and the lower chip 52 are stacked. The top chip 201 is a chip which includes, for example, a back-illuminated type imaging element.

Figure 18B:
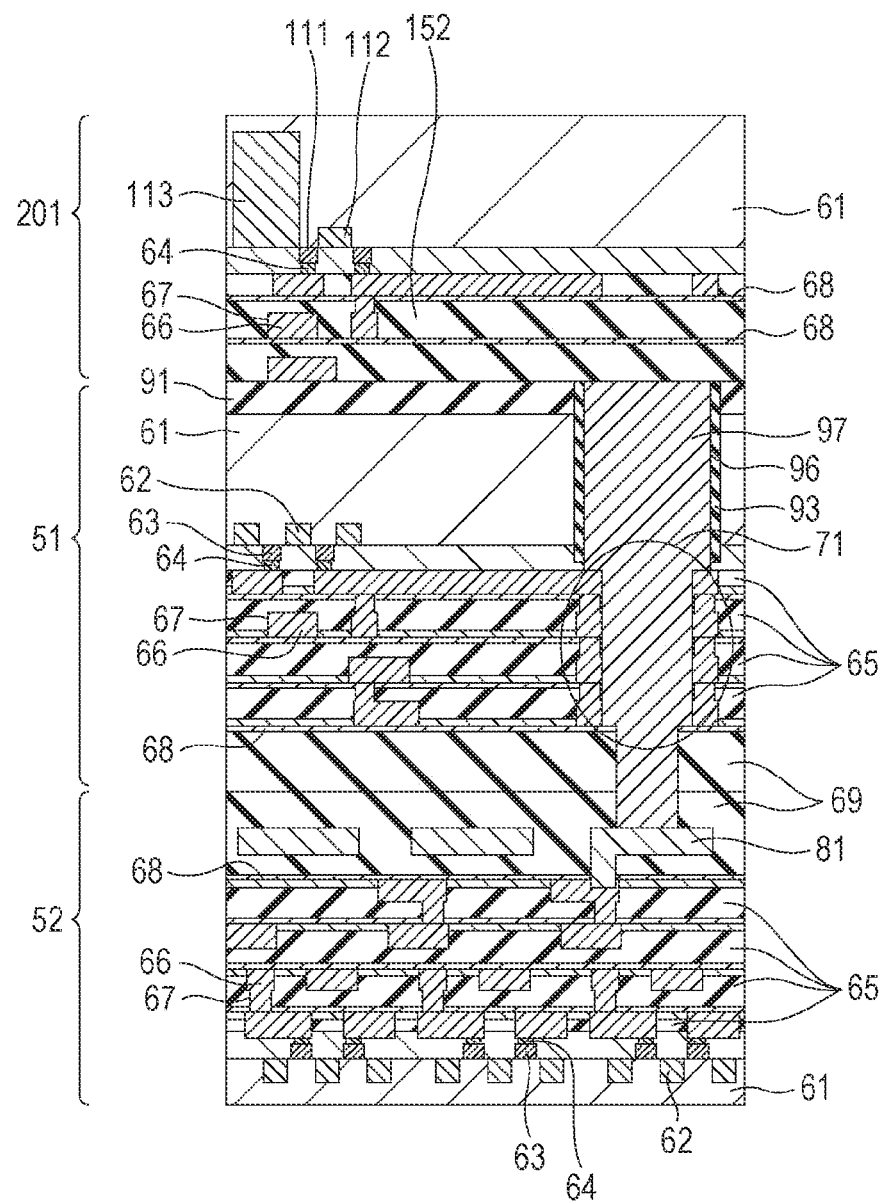

As illustrated in FIG. 18B, the top chip 201 is different from the top chip 151 of FIG. 15B only in that there is no wire, while there is the wire in the position in which the top chip 151 is in contact with the through electrode 97. That is, in the top chip 201, the photoelectric conversion unit 113, the field diffusion member 112, the transfer gate 111, and the contact member 64 are formed in the Si substrate unit 61, the top chip 201 is planarized, and thereafter, three wiring layers are formed. The three wiring layers use the Si oxide film 152 as the interlayer insulating film and use the wiring metal 66 as the wire and the via, and furthermore, the barrier metal 67 is used for the wiring metal 66. The diffusion barrier film is used between the wiring layers.

In step S215, the manufacturing device performs the through electrode forming processing described above with reference to FIG. 6, with respect to the top chip 201. That is, in step S215, the insulating film 91 is formed on the substrate of the reversed top chip 201, a lens is formed in a portion except for the portion (an internal portion of the guard ring 71) in which the through electrode is formed, on the insulating film 91, and lithography is performed. Plasma etching is performed until right before the wiring metal is exposed, and thereafter the resist is removed.

Figure 18C:
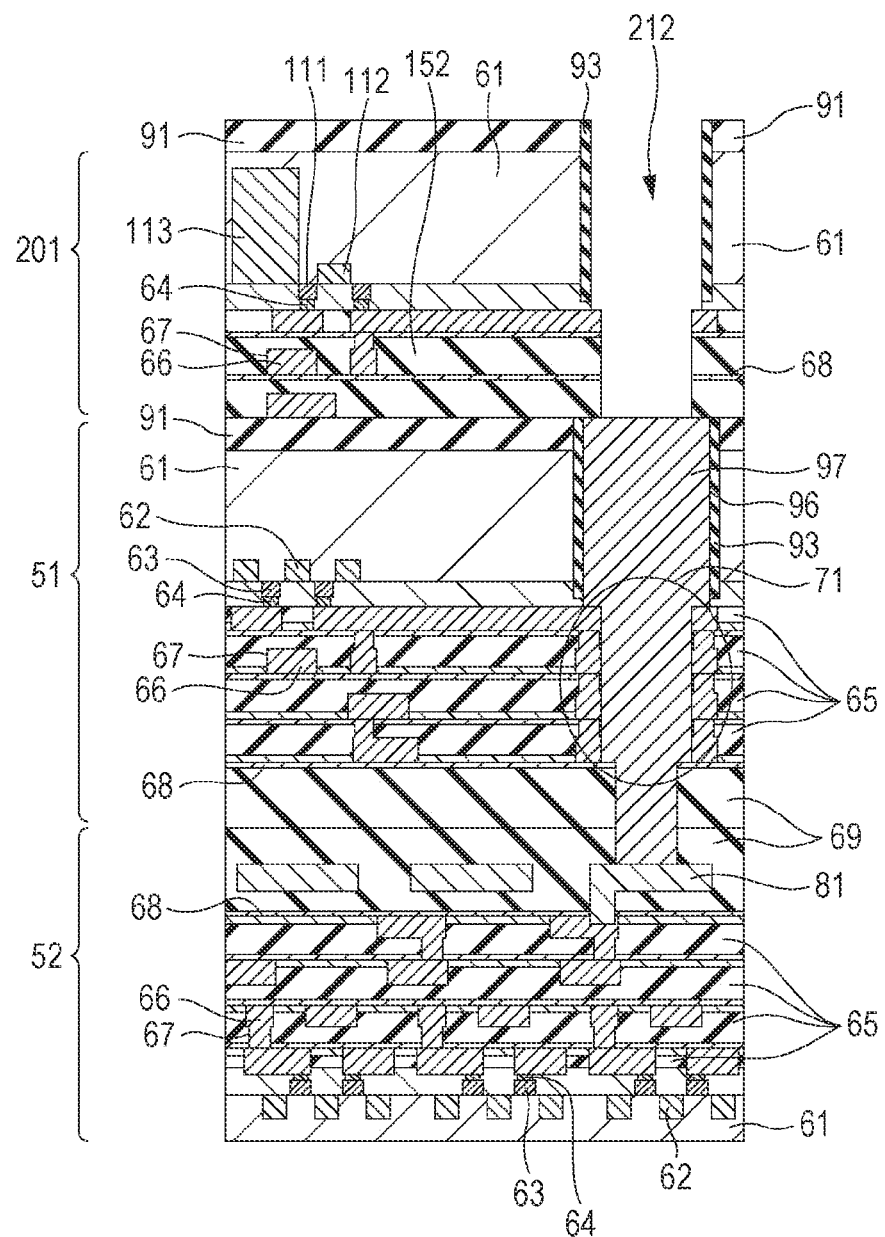

Then, as illustrated in FIG. 18C, the insulating film 93 which insulates the Si substrate unit 61 and the through electrode is formed. Thereafter, without exposing the wiring metal, a resist is formed in such a manner that a through hole 212 can be formed up to the through electrode 97 of the upper chip 51, and lithography is performed. Then, the through hole 212 is formed by the plasma etching up to the through electrode 97 of the upper chip 51, and thereafter, the resist 94 is removed. At this time, the Low-k insulating film 65 in the guard ring 71 retreats or disappears. Furthermore, a wiring layer of the top chip 201 in the guard ring 71 is exposed by the plasma etching.

Figure 19A:
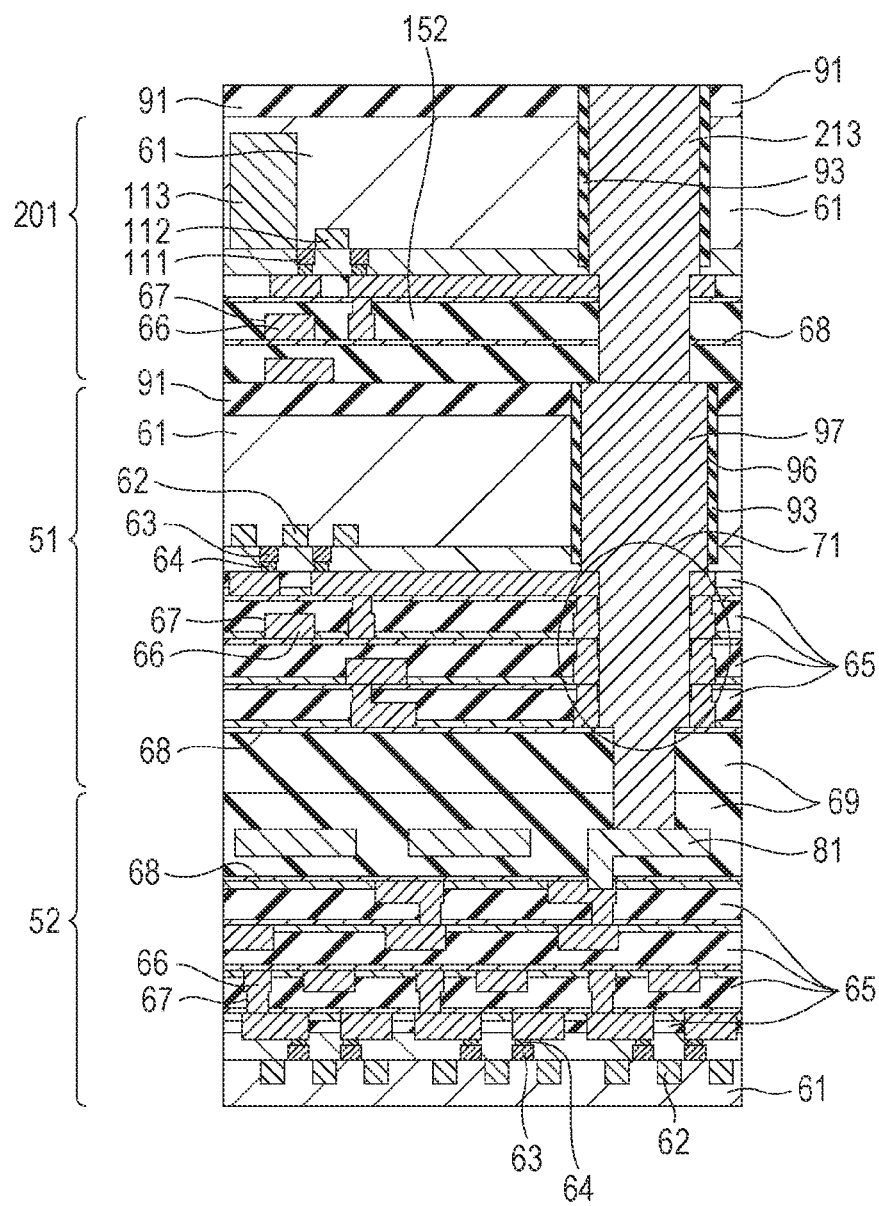
FIGS. 19A and 19B are views illustrating a manufacturing process of a solid-state imaging device.

Then, as illustrated in FIG. 19A, a film in the through hole 212 using a barrier metal 96 is formed, metal is buried, and then a through electrode 213 is formed inside the guard ring 71.

Figure 19B:
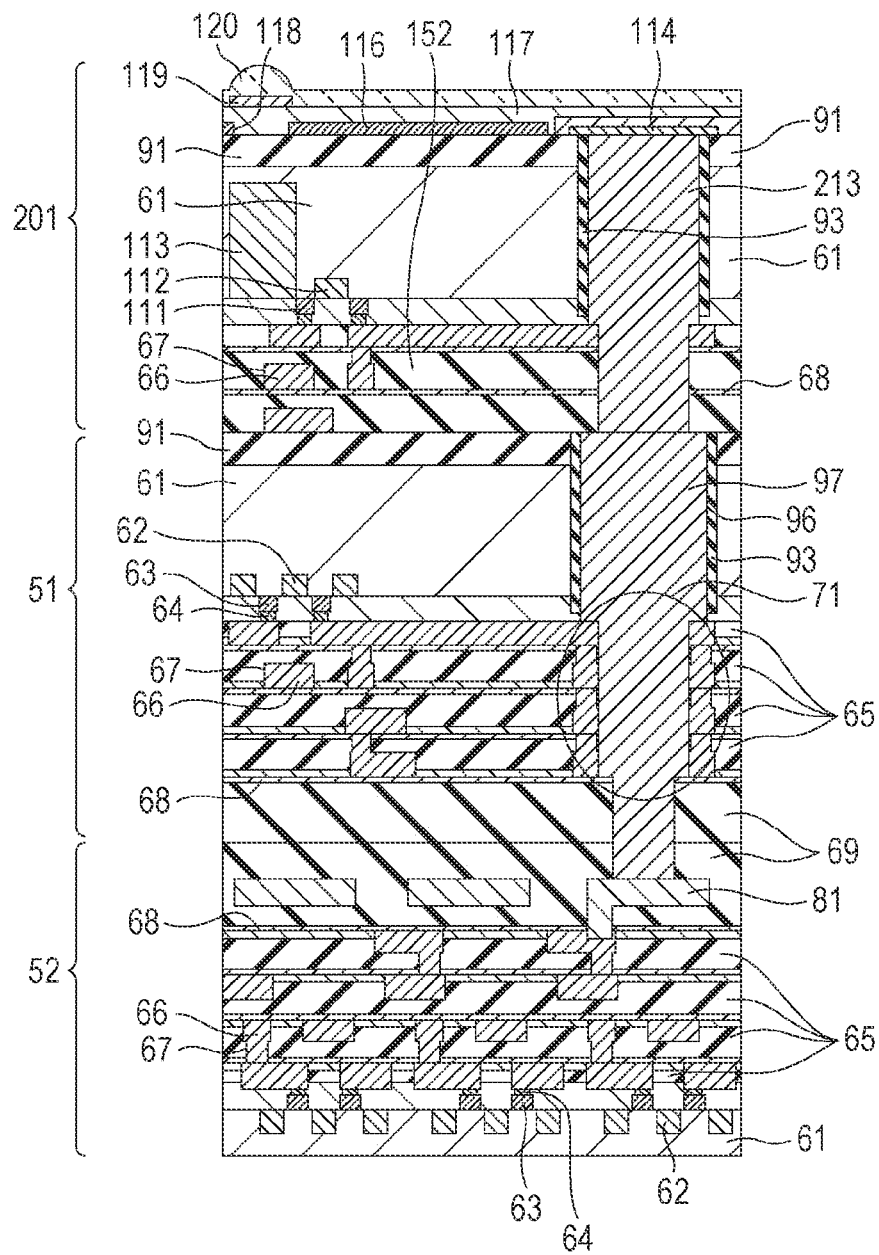

In step S216, the manufacturing device performs forming processing of a light concentration structure described above with reference to FIG. 11, on the top chip 201. That is, the diffusion barrier film 114 and the etching stop film 115 with respect to the through electrode 213 are formed. Patterning is performed except on a portion of the through electrode 97. In addition to the through electrode 213, the light-shielding film (material: Al or W) 116 is formed, the opening 118 of the light-receiving unit is formed, and thereafter, the planarization film 117 is formed. Then, as illustrated in FIG. 19B, the color filter 119 and the on-chip lens 120 are formed.

As described above, the reversed upper chip 51 is bonded on the lower chip 52, and the through electrode 97 is formed inside the guard ring 71 of the upper chip 51. As a result, a semiconductor chip including an imaging element and a semiconductor chip including a logic chip are stacked. Then, the semiconductor chip including the imaging element is further stacked on the stacked semiconductor chip, and thereby a solid-state imaging device is manufactured.

In addition, in the above description, as an example in which three semiconductor chips are stacked, an example of a semiconductor device in which a semiconductor chip having an imaging element and two semiconductor chips having a logic circuit are sequentially stacked is described. However, a configuration or a stack sequence of the semiconductor chips which are stacked in semiconductor device is not limited thereto.

The present technology is also applied to, for example, a semiconductor device in which a semiconductor chip including an imaging element, a semiconductor chip including a logic circuit, and a semiconductor chip including a memory circuit are sequentially stacked, or a semiconductor device in which a semiconductor chip including an imaging element, a semiconductor chip including a memory circuit, and a semiconductor chip including a logic circuit are sequentially stacked. In addition, the present technology is also applied to a semiconductor device in which two semiconductor chips including a logic circuit and a semiconductor chip including a memory circuit are sequentially stacked.

5. Fifth Embodiment

Modification Example

Another Connection Example of Wire of Guard Ring and Element

Figure 20A:
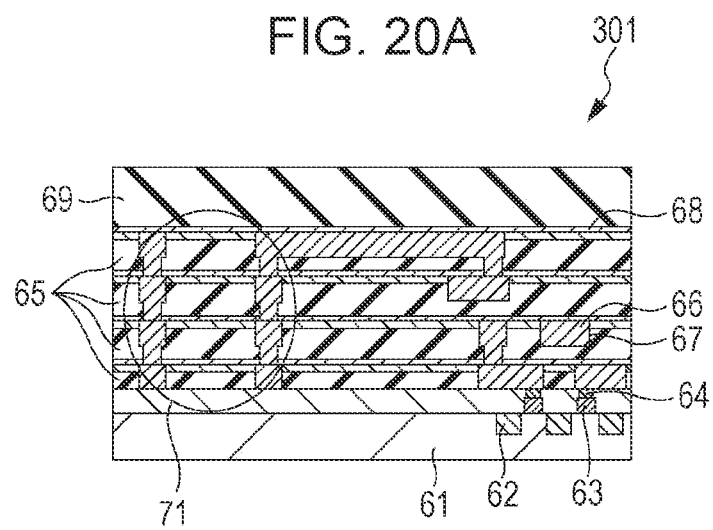
FIGS. 20A and 20B are views illustrating a modification example of a wire connection of a guard ring and an element.
Figure 20B:
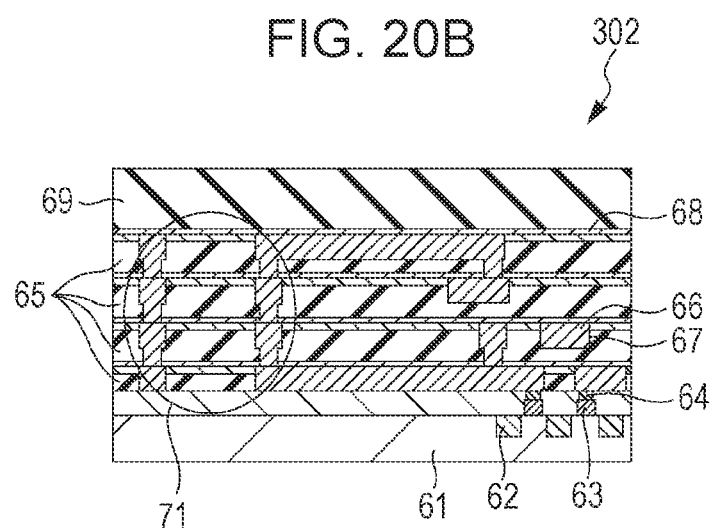

FIGS. 20A and 20B are views illustrating a connection example of wires of a guard ring and an element. In the above-described FIG. 4B, an example in which a connection of wires of an element configured with the guard ring 71, the element separation member 62, the gate 63, and the contact member 64 is performed in a bottom layer among four wiring layers is illustrated.

In contrast to this, in FIG. 20A, an example in which a connection of wires of an element configured with the guard ring 71, the element separation member 62, the gate 63, and the contact member 64 is performed in a top layer among the four wiring layers is illustrated.

In addition, in FIG. 20B, an example in which a connection of wires of an element configured with the guard ring 71, the element separation member 62, the gate 63, and the contact member 64 is performed in the top layer and the bottom layer among the four wiring layers is illustrated.

As described above, wiring of the guard ring and the element can also be performed in any layer. For example, the connection may be performed in the top layer, and may be performed in a plurality of layers. It is possible to reduce a wire length by selecting an appropriate connection from such connections.

Another Example of Forming Through Hole

Figure 6:
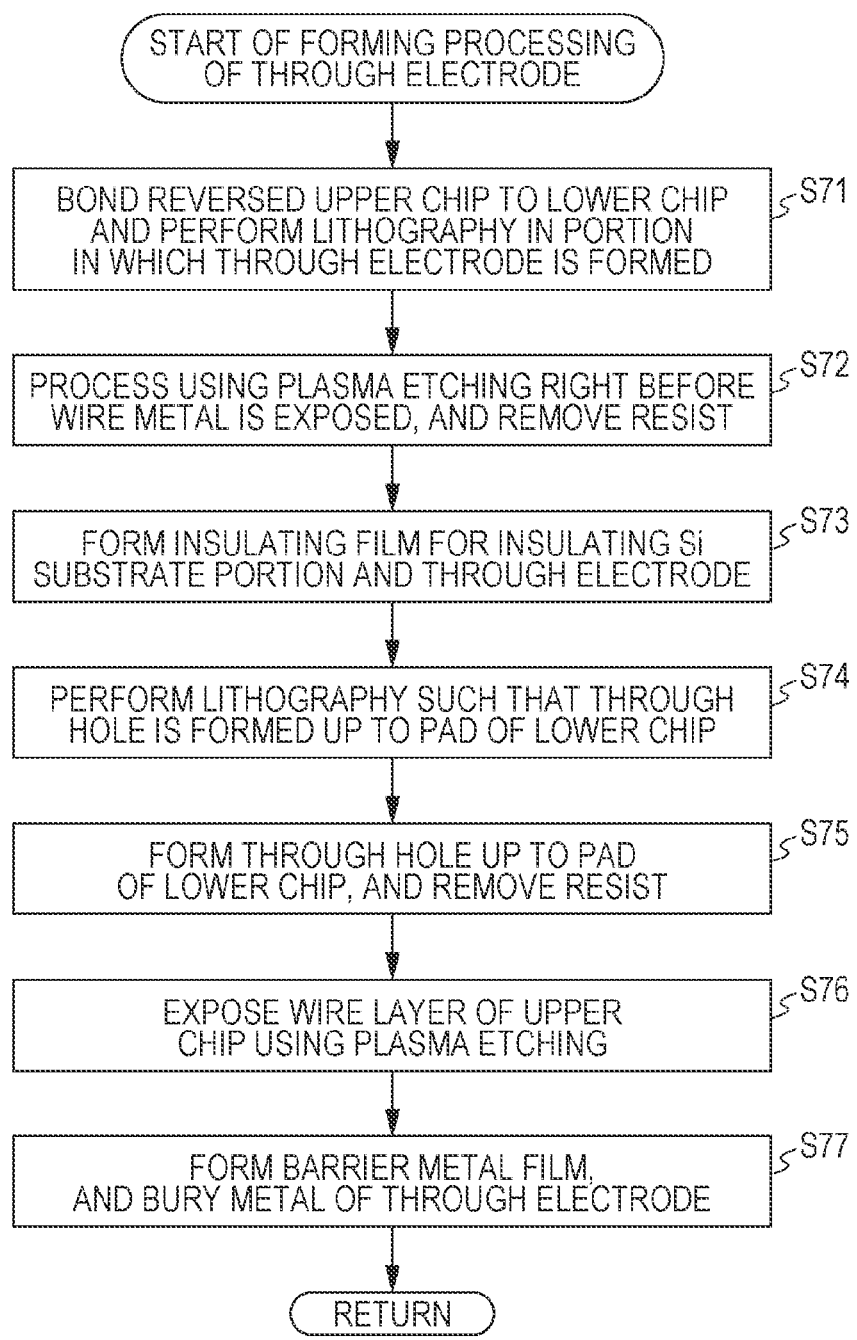
FIG. 6 is a flow chart for explaining forming processing of a through electrode.

In addition, in the above description, an example is described in which the lithography is performed in step S71 of FIG. 6, and thereafter, in step S72, the plasma etching is performed until right before the wiring metal is exposed, and the resist is removed.

Figure 21A:
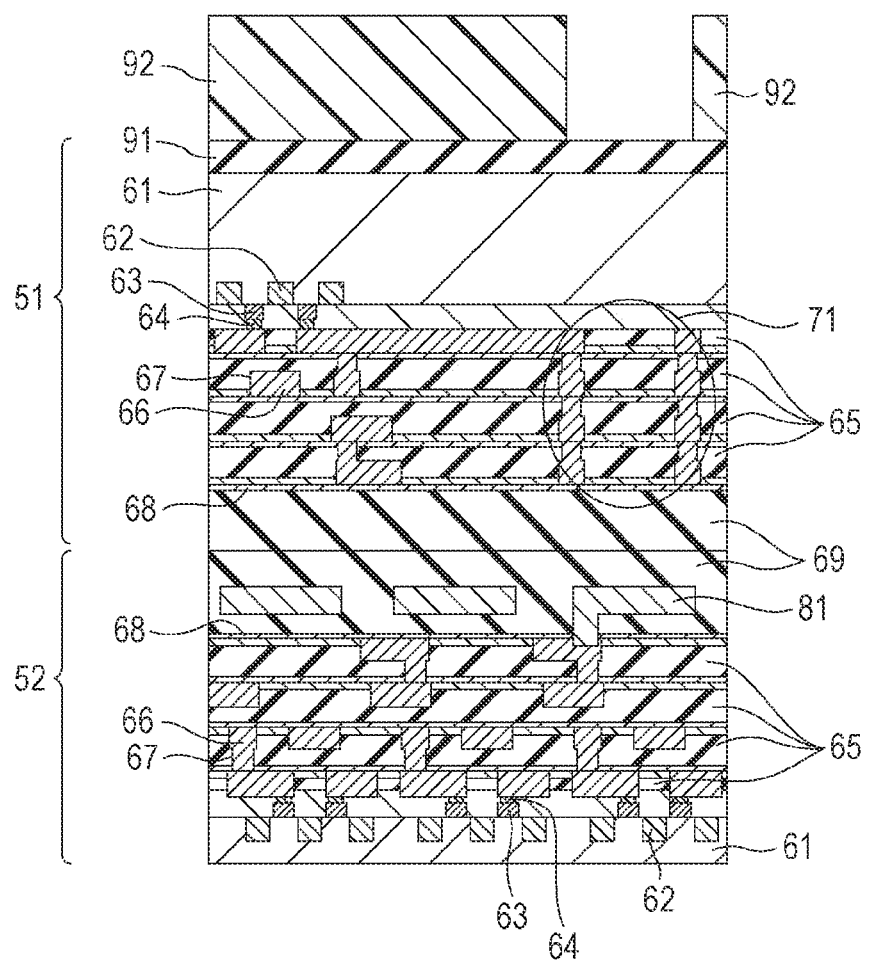
FIGS. 21A and 21B are views illustrating a modification example of forming a through hole.
Figure 21B:
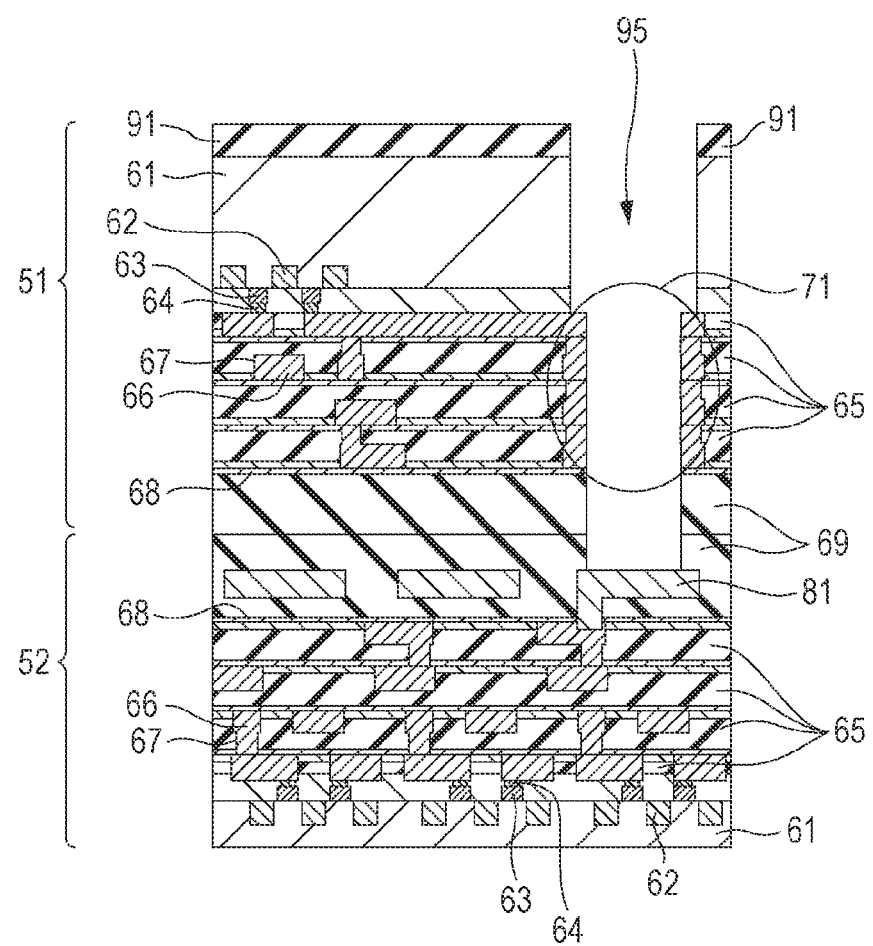

In contrast to this, as illustrated in FIG. 21A, the lithography is performed in step S71 of FIG. 6, and thereafter, the above-described plasma etching is performed in step S72, but instead, as illustrated in FIG. 21B, the through hole 95 can be formed in a self-aligned manner using the guard ring 71.

There is a possibility that failure due to instability of a process or a reaction product can occur by the plasma etching depending on metal species, but it is possible to reduce the number of processes by omitting, for example, the processes of steps S74 to S76 of FIG. 6.

Figure 22A:
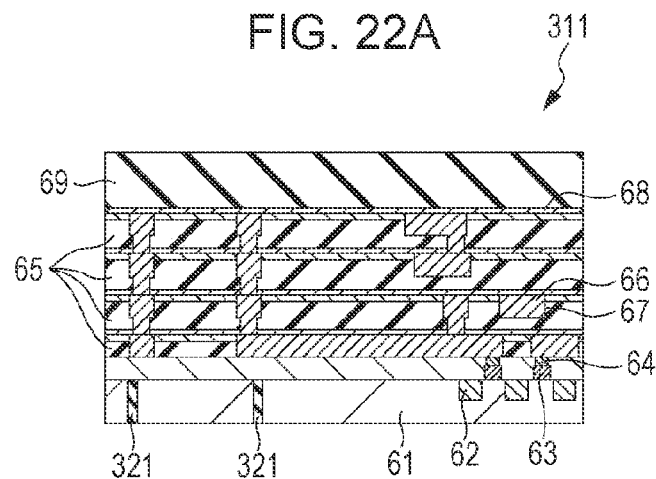
FIGS. 22A and 22B are views illustrating a modification example of forming a through hole.

Example of Acquiring Insulating Properties of Si Substrate Unit and Through Electrode In addition, an insulating film 321 is buried in a portion in which the through electrode of an upper chip 311 described above with reference to FIG. 4A is formed, that is, in the Si substrate unit 61 of a portion in which the guard ring 71 is formed, as illustrated in FIG. 22A.

Here, the description will be made again using FIG. 6 described above. In addition, FIG. 22A corresponds to FIG. 4A, FIG. 22B corresponds to FIG. 7A, FIG. 23A corresponds to FIG. 7C, and FIG. 23B corresponds to FIG. 8A.

Figure 22B:
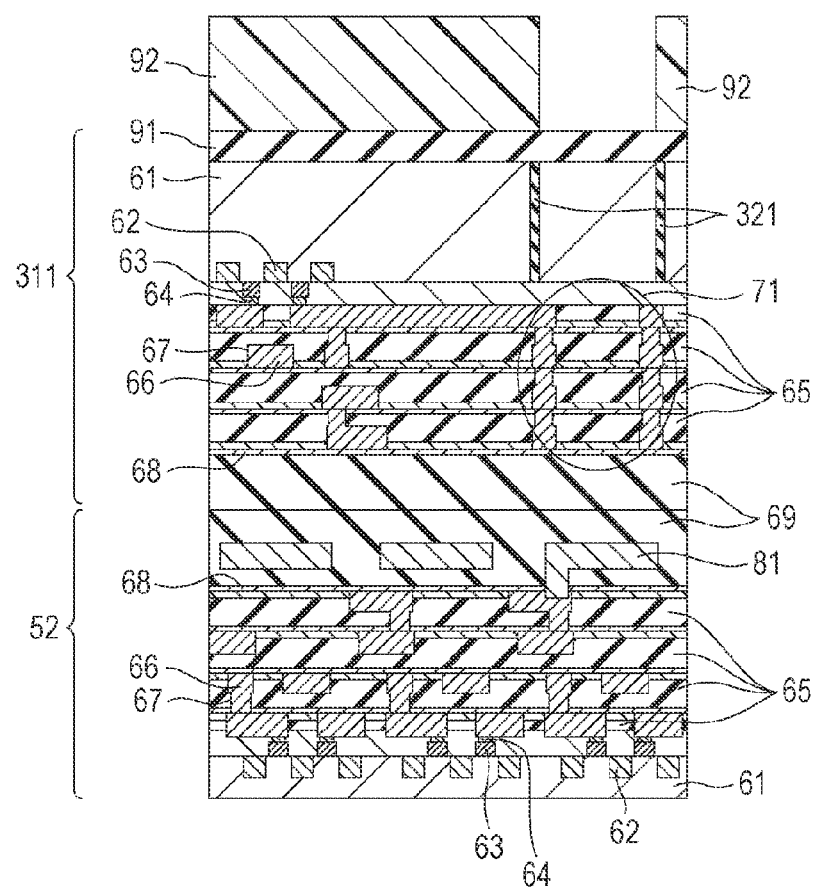

That is, the reversed upper chip 311 is bonded to the lower chip 52 in step S71 of FIG. 6, and in the upper chip 311, the lithography is performed in the portion in which the through electrode is formed. Specifically, as illustrated in FIG. 22B, the insulating film (for example, SiO2) 91 is formed on the substrate of the reversed upper chip 311, and on the insulating film, the resist 92 is formed in a portion except for the portion (internal portion of guard ring 71) in which the through electrode is formed, and then the lithography is performed.

Figure 23A:
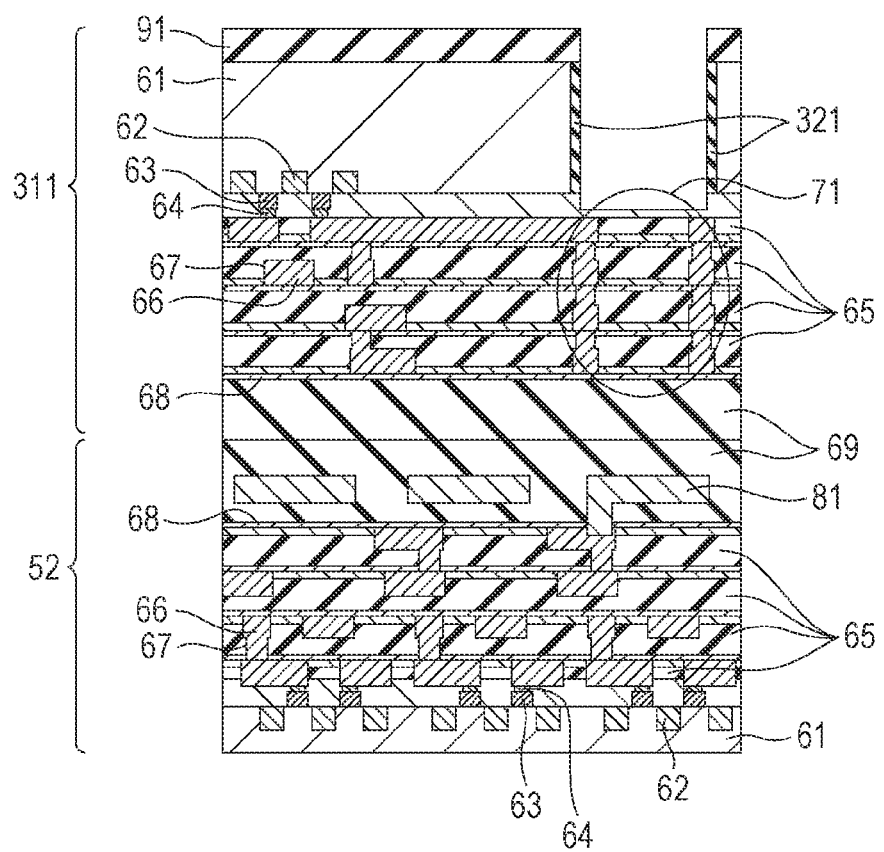
FIGS. 23A and 23B are views illustrating a modification example of acquiring insulating properties of an Si substrate unit and a through electrode.

In step S72, as illustrated in FIG. 23A, the plasma etching is performed until right before the wiring metal is exposed, and thereafter, the resist 92 is removed.

Here, since the insulating film 321 is buried in the Si substrate unit 61 of the upper chip 311, the processing of step S73 is skipped.

Figure 23B:
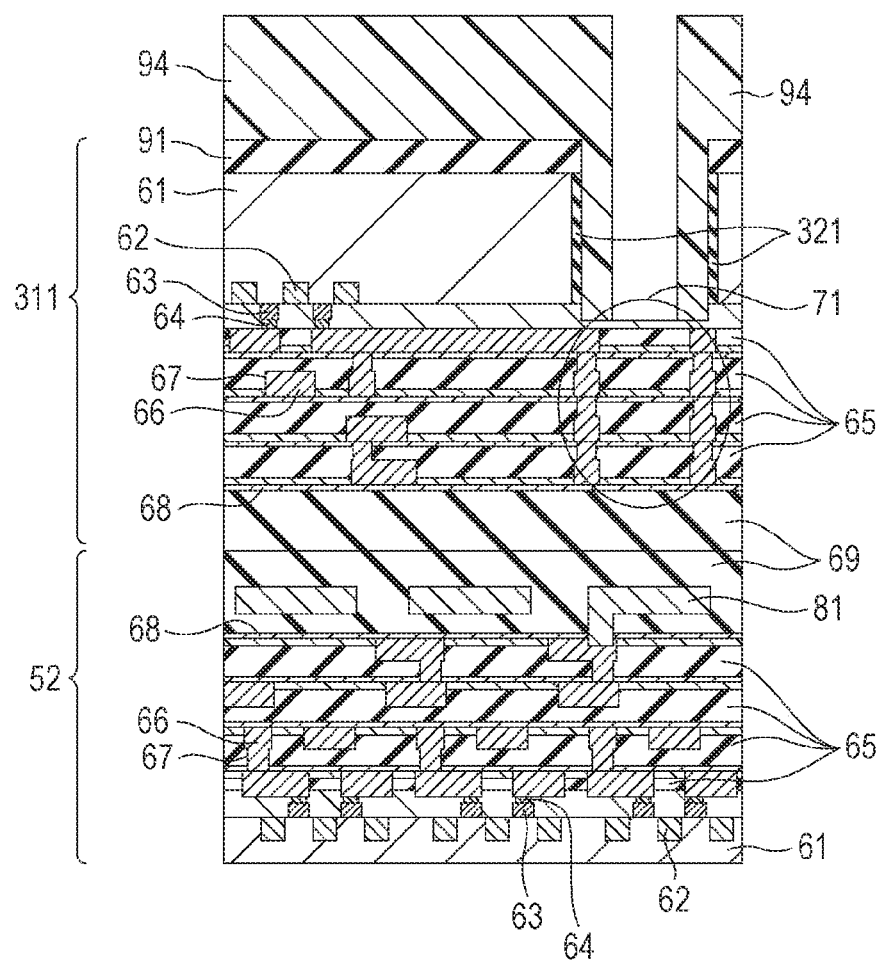

In step S74, as illustrated in FIG. 23B, without exposing the wiring metal, the resist 94 is formed in such a manner that the through hole 95 can be formed up to the pad 81 of the lower chip 52, and the lithography is performed.

As described above, in the forming processing of the through electrode of FIG. 6 described above, step S73 can be skipped. That is, without performing the process of step S73, it is possible to acquire the insulating properties of the Si substrate unit and the through electrode, and to reduce the number of processes.

Contact Method of Through Electrode and Guard Ring

In addition, in the example of FIG. 9B described above, an example is described in which the through electrode 97 is in contact with the entirety (four wiring layers) of the guard ring 71, but may also be bonded to a portion thereof.

Figure 24A:
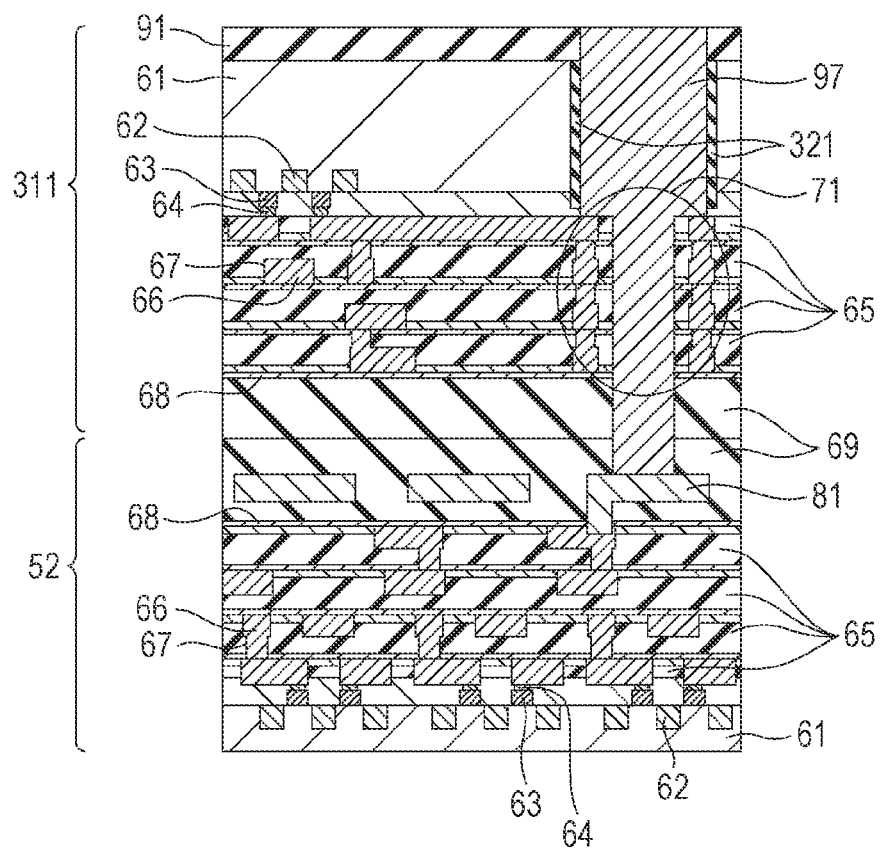
FIGS. 24A and 24B are views illustrating a modification example of a bonding method of a through electrode and a guard ring.
Figure 24B:
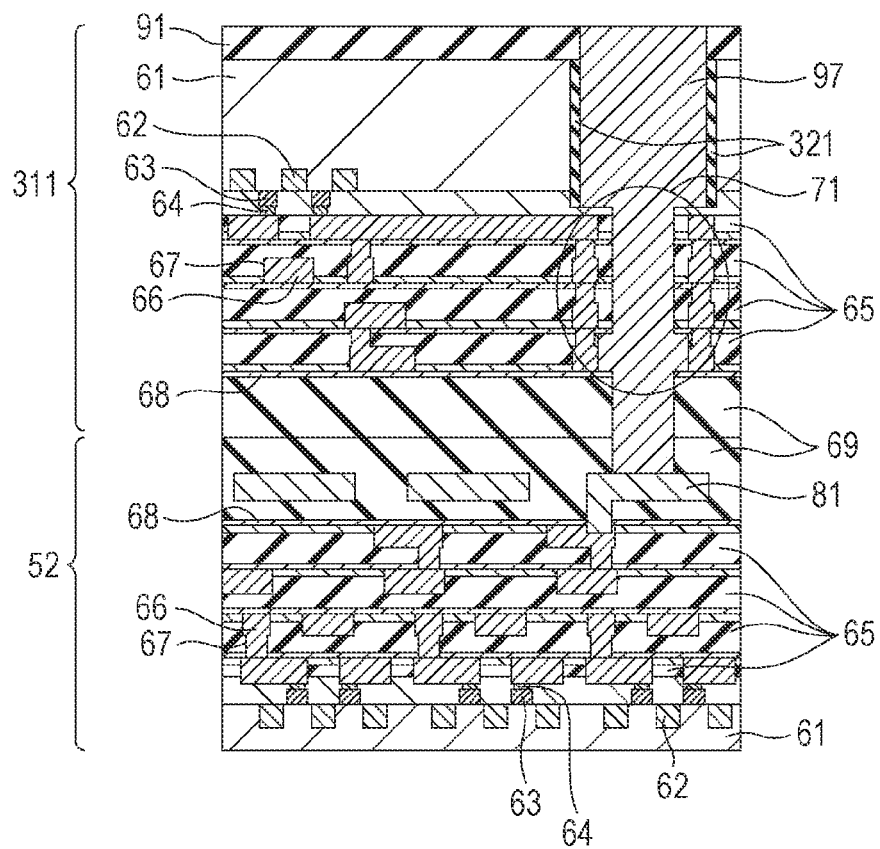

That is, in FIG. 24A, when the Si substrate unit 61 of the upper chip 311 is viewed from bottom, the upper chip 311 may be formed in such a manner that only the bottom layer of the four wiring layers is in contact with the guard ring 71. Alternatively, in FIG. 24B, when the Si substrate unit 61 of the upper chip 311 is viewed from bottom, the upper chip 311 may be formed in such a manner that only the top layer of the four wiring layers is in contact with the guard ring 71. In addition, a layer in which the guard ring 71 in contact with the upper chip 51 id formed is not limited by the bottom layer and the top layer, and it may be any layer, or may be a plurality of layers.

Even in such a structure, absorption of a Low-k film on an element side can be reduced. In addition, for example, abnormality of the processed shape of Low-k insulation film retreat can also be improved, compared to a shared contact through electrode or the like in a case where the Low-k insulating film which is used for the semiconductor element of a state-of-the-art LSI is used as the interlayer insulating film, in a configuration in which the wiring of the chip is bonded in a single layer with respect to the through electrode.

Modification Example of Width of Guard Ring

Figure 25A:
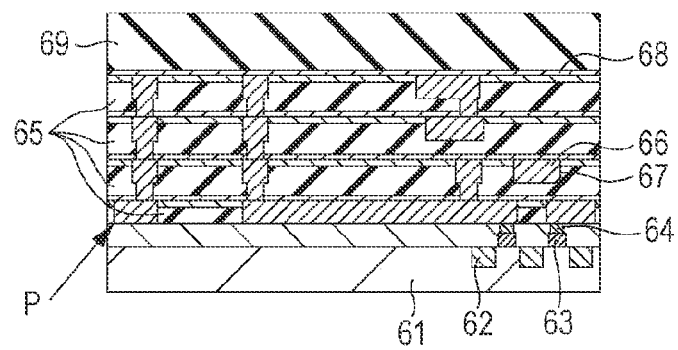
FIGS. 25A to 25C are views illustrating a modification example of a width of a guard ring.
Figure 25B:
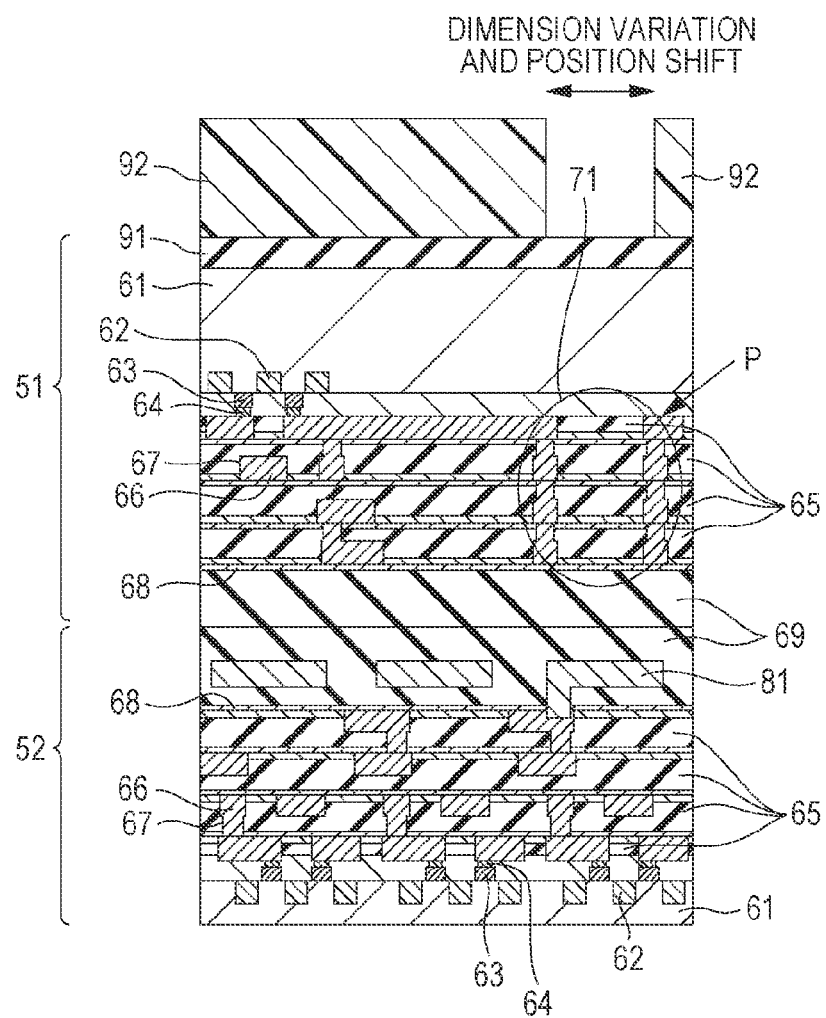
Figure 25C:
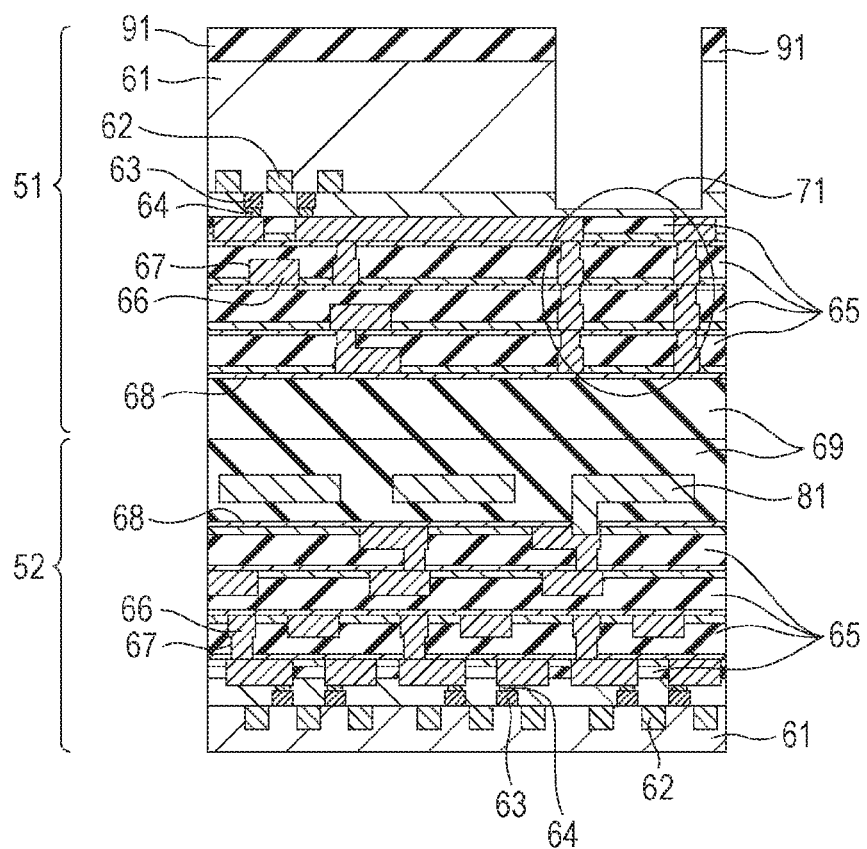

In addition, in FIG. 4B described above, an example is described in which the guard ring 71 has an equal width in all of the four wiring layers, while not being limited thereto. That is, as illustrated by an arrow P of FIG. 25A, it is possible to widen the width of the guard ring 71 of only the bottom layer in FIG. 25A. As a result, it is possible to increase a margin with respect to dimension variation or position shift of the resist 92 at the time of the lithography in step S71 of FIG. 6, and to improve a failure rate.

In addition, in contrast to this, if a width of the entire guard ring 71 is widened, design width (DM) violation can occur at the time of mask design.

As described above, by forming the guard ring, there is a favorable shared contact with an exclusive area and the number of process steps, and when the through electrode is formed, the Low-k interlayer insulating film is shielded almost completely from the plasma, the cleaning chemical liquid, and the atmosphere. Thus, it is possible to decrease the failure rate or to improve the reliability.

In addition, in the above description, an example is described in which a back-illumination type imaging element is used as an imaging element which is included in a chip, but a surface illumination type imaging element may be used.

In addition, the present technology is not limited to being applied to a solid-state imaging device such as an image sensor. That is, the present technology can be applied to all kinds of electronic apparatuses, which use a solid-state imaging device for an image capturing unit (photoelectric conversion unit), such as an imaging device such as a digital still camera or a video camera, a mobile terminal device having an imaging function, or a copying machine which uses a solid-state imaging device for an image reading unit.

Furthermore, the present technology is not limited to a solid-state imaging device such as an image sensor, and can also be applied to a semiconductor device in which two semiconductor chips including a logic circuit and a semiconductor chip including a memory circuit are stacked.

6. Sixth Embodiment

Configuration Example of Electronic Apparatus

Figure 26:
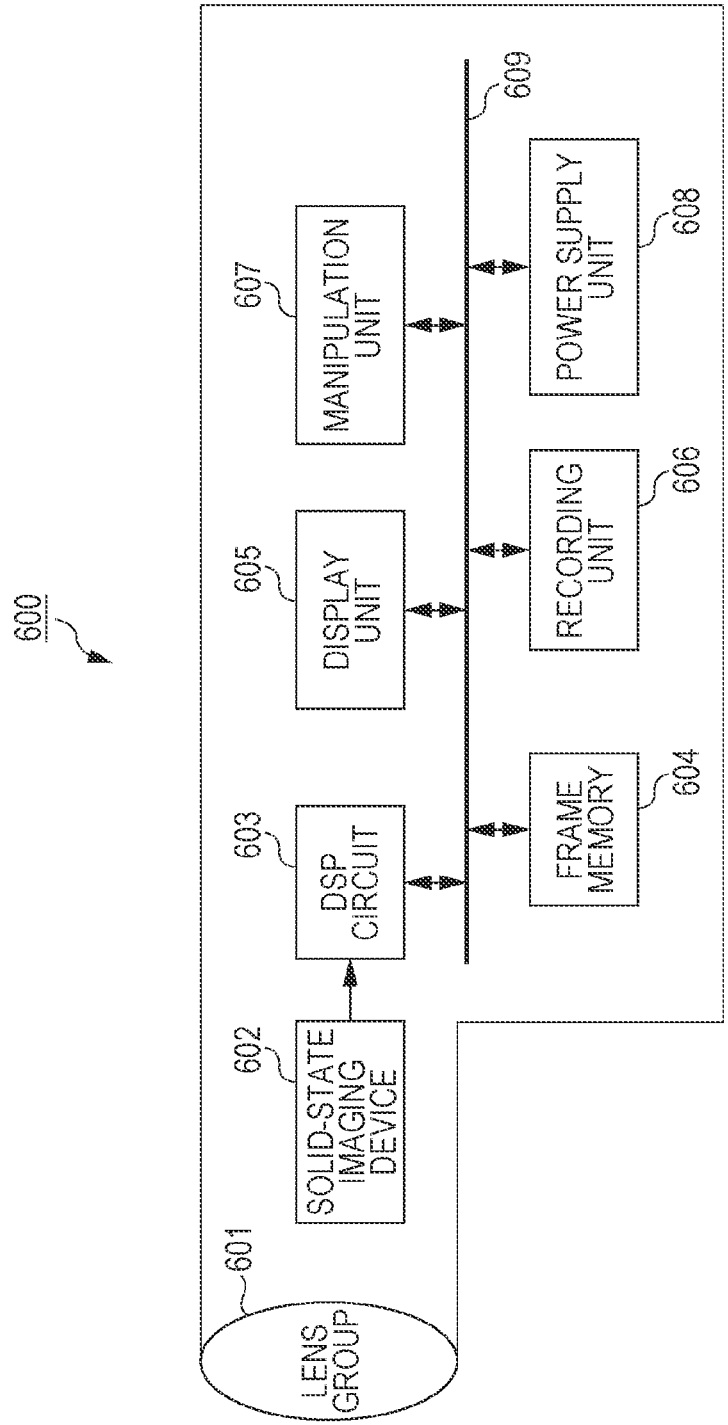
FIG. 26 is a block diagram illustrating a configuration example of an electronic apparatus according to a sixth embodiment of the present technology.

FIG. 26 is a block diagram illustrating a configuration example of a camera device as an electronic apparatus to which the present technology is applied.

A camera device 600 of FIG. 26 includes an optical unit 601 configured by a lens group or the like, a solid-state imaging device (imaging device) 602 in which each configuration of the above-described pixels 2 is employed, and a DSP circuit 603 which is a camera signal processing circuit. In addition, the camera device 600 also includes a frame memory 604, a display unit 605, a recording unit 606, a manipulation unit 607, and a power supply unit 608. The DSP circuit 603, the frame memory 604, the display unit 605, the recording unit 606, the manipulation unit 607, and the power supply unit 608 are connected to each other through a bus line 609.

The optical unit 601 captures incident light (image light) from a subject and forms an image on an imaging plane of the solid-state imaging device 602. The solid-state imaging device 602 converts an amount of light of the incident light formed on the imaging plane by the optical unit 601 into an electrical signal by a pixel and outputs the electrical signal as a pixel signal. It is possible to use the solid-state imaging device according to the above-described embodiments as the solid-state imaging device 602.

The display unit 605 is configured by a panel type display device such as a liquid crystal panel or an organic Electro Luminescence (EL) panel, and displays a moving image which is imaged by the solid-state imaging device 602 or a still image. The recording unit 606 records the moving image which is imaged by the solid-state imaging device 602 or the still image in a recording medium such as a video tape or a digital versatile disc (DVD).

The manipulation unit 607 generates a manipulation command with regard to various functions which are given to the camera device 600, according to manipulation performed by a user. The power supply unit 608 appropriately supplies the DSP circuit 603, the frame memory 604, the display unit 605, the recording unit 606, and the manipulation unit 607 with various power supply voltages which become operational power supply voltages thereof.

In addition, in the present specification, the steps in which a series of processes described above is described include processing which is performed in time series according to the described sequence, and also include processing which is performed in parallel or separately, even if it is not the processing which is necessarily performed in time series.

In addition, the embodiments according to the present technology are not limited to the embodiments described above, and various modifications can be performed in a range without departing from the gist of the present technology.

In addition, each step described in the flow charts described above can be performed in one device, and can be performed separately in a plurality of devices.

Furthermore, if a plurality of processings are included in one step, the plurality of processings included in the one step can be performed in one device, and can be performed separately in a plurality of devices.

As described above, one device (or processing unit) may be divided so as to be configured by a plurality of devices (or processing units). In contrast, in the above description, the plurality of devices (or processing units) may be combined so as to be configured by one device (or processing unit). In addition, another configuration except for those described above may be added to the configuration of each device (or each processing unit). Furthermore, if the configurations or the operations of all the systems are the same as each other, a portion of the configuration of a device (or processing unit) may be included in the configuration of another device (or another processing unit). That is, the present technology is not limited to the embodiments described above, and various modifications can be performed in a range without departing from the gist of the present technology.

As described above, appropriate embodiments according to the present technology are described in detail with reference to the attached drawings, but the present technology is not limited to such examples. It is obvious that various modifications or revisions may be conceived by those skilled in the art to which the present technology belongs, within the technical scope described in the claims. It is also understood that such things naturally belong to the technical scope of the present technology.

In addition, the present technology can also be made by the following configurations.

(1) A semiconductor device including: a wiring layer that includes at least one low-dielectric rate interlayer insulating film layer; a guard ring that is formed by placing in series a wire and a via so as to be in contact with a through electrode, in a portion in which the through electrode passing through the wiring layer is formed; and the through electrode that is formed by being buried inside the guard ring.

(2) The semiconductor device described in (1), in which the guard ring is electrically connected.

(3) The semiconductor device described in (1) or (2), in which a plurality of semiconductor substrates are stacked, and in which the semiconductor substrate including the wiring layer is electrically connected to another semiconductor substrate through the through electrode.

(4) The semiconductor device described in (3), in which the semiconductor substrate including a contact image sensor (CIS) is stacked on the semiconductor substrate including the wiring layer.

(5) The semiconductor device described in (3), in which the semiconductor substrate including the wiring layer is configured to include a signal processing circuit.

(6) The semiconductor device described in (3), in which another semiconductor substrate is configured to include a signal processing circuit.

(7) The semiconductor device described in (3), in which another semiconductor substrate is configured to include a storage medium circuit.

(8) The semiconductor device described in (3), in which the semiconductor substrate including the wiring layer is configured to include a contact image sensor (CIS).

(9) A manufacturing method of a semiconductor device, including: forming a guard ring by placing in series a wire and a via so as to be in contact with a through electrode, in a portion in which the through electrode passing through a wiring layer is formed, in the wiring layer that includes at least one low-dielectric rate interlayer insulating film layer, using a manufacturing device; and forming the through electrode inside the formed guard ring, using the manufacturing device.

(10) An electronic apparatus including: a semiconductor device, in which the semiconductor device includes a wiring layer that includes at least one low-dielectric rate interlayer insulating film layer; a guard ring that is formed by placing in series a wire and a via so as to be in contact with a through electrode, in a portion in which the through electrode passing through the wiring layer is formed; and the through electrode that is formed by being buried inside the guard ring.

(11) The electronic apparatus described in (10), in which the semiconductor device is a solid-state imaging device, and in which the semiconductor device further includes a signal processing circuit that processes an output signal that is output from the solid-state imaging device; and an optical system that makes incident light be incident on the solid-state imaging device.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a first semiconductor substrate including:
      a first plurality of wiring layers, each wiring layer of the first plurality of wiring layers including a wire, at least one low-dielectric rate interlayer insulating film layer, and a diffusion barrier film, wherein the first plurality of wiring layers is arranged such that at least one low-dielectric rate interlayer insulating film layer is between each of the wire and the diffusion barrier film and the diffusion barrier film is disposed on each wire of the first plurality of wiring layers;
      a guard ring including a wire from each of the first plurality of wiring layers and a plurality of vias arranged in a stacked structure and in contact with a through electrode, wherein each wire from each of the first plurality of wiring layers is electrically connected to a respective via of the plurality of vias, and at least one via of the plurality of vias includes metal material disposed between the diffusion barrier film and the through electrode; and
   a second semiconductor substrate including:
      a second plurality of wiring layers, each wiring layer of the second plurality of wiring layers including a wire, at least one interlayer insulating film layer, and a diffusion barrier film, wherein the second plurality of wiring layers is arranged such that at least one interlayer insulating film layer is between each of the wire and the diffusion barrier film and each wire of the second plurality of wiring layers is disposed on the diffusion barrier film; and a pad electrically connected to a wire of a wiring layer of the second plurality of wiring layers, wherein the through electrode is buried inside the guard ring and electrically connected to the pad.

2. The semiconductor device according to claim 1, wherein of the first and second semiconductor substrates are stacked, and wherein the first semiconductor substrate is electrically connected to the second semiconductor substrate through the through electrode.

3. The semiconductor device according to claim 2, wherein a semiconductor substrate including a contact image sensor (CIS) is stacked on the first semiconductor substrate.

4. The semiconductor device according to claim 2, wherein the first semiconductor substrate includes a signal processing circuit.

5. The semiconductor device according to claim 2, wherein the first semiconductor substrate includes a contact image sensor (CIS).

6. The semiconductor device according to claim 2, wherein another semiconductor substrate includes a signal processing circuit.

7. The semiconductor device according to claim 2, wherein a third semiconductor substrate includes a storage medium circuit.

8. The semiconductor device according to claim 1, wherein the pad is located within an insulating film of the second semiconductor substrate.

9. An electronic apparatus comprising:
a semiconductor device, the semiconductor device including:
a first semiconductor substrate including:
a first plurality of wiring layers, each wiring layer of the first plurality of wiring layers including a wire, at least one low-dielectric rate interlayer insulating film layer, and a diffusion barrier film, wherein the first plurality of wiring layers is arranged such that at least one low-dielectric rate interlayer insulating film layer is between each of the wire and the diffusion barrier film and the diffusion barrier film is disposed on each wire of the first plurality of wiring layers;

a guard ring including a wire from each of the first plurality of wiring layers and a plurality of vias arranged in a stacked structure and in contact with a through electrode, wherein each wire from each of the first plurality of wiring layers is electrically connected to a respective via of the plurality of vias, and at least one via of the plurality of vias includes metal material disposed between the diffusion barrier film and the through electrode; and a second semiconductor substrate including:
a second plurality of wiring layers, each wiring layer of the second plurality of wiring layers including a wire, at least one interlayer insulating film layer, and a diffusion barrier film, wherein the second plurality of wiring layers is arranged such that at least one interlayer insulating film layer is between each of the wire and the diffusion barrier film and each wire of the second plurality of wiring layers is disposed on the diffusion barrier film; and a pad electrically connected to a wire of a wiring layer of the second plurality of wiring layers, wherein the through electrode is buried inside the guard ring and electrically connected to the pad; and a lens configured to direct light to an imaging surface of the semiconductor device.

10. The electronic apparatus according to claim 9, wherein the semiconductor device is a solid-state imaging device, and wherein the semiconductor device further includes:
a signal processing circuit that processes an output signal that is output from the solid-state imaging device; and
an optical system that forms an image on an imaging plane of the solid-state imaging device.

11. The electronic apparatus according to claim 9, wherein of the first and second semiconductor substrates are stacked, and wherein the first semiconductor substrate is electrically connected to the second semiconductor substrate through the through electrode.

12. The electronic apparatus according to claim 11, wherein the first semiconductor substrate includes a signal processing circuit.

13. The electronic apparatus according to claim 11, wherein a third semiconductor substrate includes a storage medium circuit.

14. The semiconductor device according to claim 9, wherein the pad is located within an insulating film of the second semiconductor substrate.

* * * * *